(12) United States Patent
Ishii

(10) Patent No.: US 11,405,595 B2
(45) Date of Patent: Aug. 2, 2022

(54) DISPLAY PANEL CONTROL DEVICE, DISPLAY DEVICE, AND METHOD FOR DRIVING DISPLAY PANEL

(71) Applicant: JOLED INC., Tokyo (JP)

(72) Inventor: Hiroaki Ishii, Tokyo (JP)

(73) Assignee: JOLED INC., Tokyo (JP)

( * ) Notice: Subject to any disclaimer, the term of this patent is extended or adjusted under 35 U.S.C. 154(b) by 116 days.

(21) Appl. No.: 16/748,360

(22) Filed: Jan. 21, 2020

(65) Prior Publication Data

US 2020/0162704 A1    May 21, 2020

Related U.S. Application Data

(63) Continuation of application No. 15/991,848, filed on May 29, 2018, now Pat. No. 10,574,946.

(30) Foreign Application Priority Data

Jul. 4, 2017    (JP) .............................. JP2017-131413

(51) Int. Cl.
    *H04N 7/56*       (2006.01)
    *H04N 5/04*       (2006.01)
    (Continued)

(52) U.S. Cl.
    CPC .............. *H04N 7/56* (2013.01); *G09G 3/3233* (2013.01); *G09G 3/3258* (2013.01);
    (Continued)

(58) Field of Classification Search
    CPC . G09G 3/2018–204; G09G 3/32–3291; G09G 2320/0247; G09G 2340/0435;
    (Continued)

(56) References Cited

U.S. PATENT DOCUMENTS 8,339,336 B2    12/2012 Goden et al.
8,390,539 B2     3/2013 Kawasaki et al.
(Continued)

FOREIGN PATENT DOCUMENTS

JP    2006-030516       2/2006
WO    2016-024307 A1    2/2016

OTHER PUBLICATIONS

Office Action, dated Jun. 2, 2020, issued by the Japan Patent Office (JPO) for the corresponding Japanese Patent Application No. 2017-131413.

*Primary Examiner* — Amr A Awad
*Assistant Examiner* — Aaron Midkiff
(74) *Attorney, Agent, or Firm* — Greenblum & Bernstein, P.L.C.

(57) ABSTRACT

A method for driving a display panel displays a video image signal that includes a plurality of images having different frame periods. The method includes setting a frame period including one or more light emission periods, and one or more light extinction periods. The method also includes dividing at least one frame period into a plurality of light emission periods and a plurality of light extinction periods, and adjusting lengths of the plurality of light emission periods and lengths of the plurality of light extinction periods based on a ratio between a maximum frequency of the frame period and a currently set frequency of the frame period. The method further includes displaying the video image signal by causing light emitting elements of the display panel to emit light during the adjusted light emission periods, and to extinguish light during the adjusted light extinction periods.

15 Claims, 17 Drawing Sheets

(51) Int. Cl.
*H01L 27/32* (2006.01)
*G09G 3/3258* (2016.01)
*G09G 3/3233* (2016.01)

(52) U.S. Cl.
CPC .......... *H01L 27/3276* (2013.01); *H04N 5/04* (2013.01); *G09G 2300/0861* (2013.01); *G09G 2310/0251* (2013.01); *G09G 2310/0262* (2013.01); *G09G 2310/0264* (2013.01); *G09G 2320/0247* (2013.01)

(58) Field of Classification Search
CPC .......... G09G 3/3233–3258; G09G 2310/0251; G09G 2320/043; G09G 3/2014; G09G 2300/0861; G09G 2300/0866; G09G 2310/08; G09G 2310/0262; G09G 2310/0264; H04N 5/04; H04N 7/56; H01L 27/3276
USPC ..................................... 345/76–83
See application file for complete search history.

(56) References Cited

U.S. PATENT DOCUMENTS

| | | | |
|---|---|---|---|
| 8,395,570 | B2 | 3/2013 | Maru et al. |
| 8,514,209 | B2 | 8/2013 | Ikeda et al. |
| 8,847,934 | B2 | 9/2014 | Yamashita et al. |
| 9,966,007 | B2 | 5/2018 | Cho et al. |
| 2006/0028412 | A1* | 2/2006 | Miyagawa ........... G09G 3/3258 345/77 |
| 2007/0126757 | A1 | 6/2007 | Itoh et al. |
| 2009/0207193 | A1 | 8/2009 | Isobe et al. |
| 2010/0026677 | A1 | 2/2010 | Shikina et al. |
| 2012/0068992 | A1* | 3/2012 | Toyomura ........... G09G 3/3233 345/212 |
| 2013/0127929 | A1 | 5/2013 | Isobe et al. |
| 2014/0307009 | A1 | 10/2014 | Hasegawa et al. |
| 2014/0327664 | A1 | 11/2014 | Kanda et al. |
| 2014/0362128 | A1 | 12/2014 | Huang |
| 2017/0004766 | A1* | 1/2017 | Cho .................... G09G 3/3266 |
| 2017/0251170 | A1 | 8/2017 | Kabuto |

* cited by examiner

FIG. 10

| $V_{min}$ | $V_{now}$ | $V_{diff}$ | Gate waveform generation parameter |
|---|---|---|---|
| 100 | 100 | 0 | 1.000 |
| 100 | 110 | 10 | 1.100 |
| 100 | 120 | 20 | 1.200 |
| ⋮ | ⋮ | ⋮ | ⋮ |
| 100 | 200 | 0 | 2.000 |
| ⋮ | ⋮ | ⋮ | ⋮ |
| 150 | 150 | 0 | 1.000 |
| 150 | 160 | 10 | 1.066 |
| ⋮ | ⋮ | ⋮ | ⋮ |
| 200 | 200 | 0 | 1.000 |
| 200 | 210 | 10 | 1.050 |
| ⋮ | ⋮ | ⋮ | ⋮ |

70

DISPLAY PANEL CONTROL DEVICE, DISPLAY DEVICE, AND METHOD FOR DRIVING DISPLAY PANEL

CROSS REFERENCE TO RELATED APPLICATIONS

This is a continuation application of U.S. patent application Ser. No. 15/991,848, filed May 29, 2018, which claims the benefit of Japanese Patent Application No. 2017-131413, filed Jul. 4, 2017. The disclosure of each of the above-mentioned documents, including the specifications, drawings, and claims, is expressly incorporated herein by reference in its entirety.

FIELD

The present disclosure relates to a display panel control device, a display device, and a method for driving a display panel.

BACKGROUND

Conventionally, in a computer or a mobile device, a video image is displayed on a display screen by a video image processing device called GPU (Graphics Processing Unit) (see, for example, Patent Literature 1 (PTL 1)).

PTL 1 discloses a display device in which the number of sub-frames that constitute one frame is determined according to a set on-duty ratio. Then, display driving is performed based on the determined number of sub-frames.

Also, in recent years, the video image display rate on a display screen is determined increasingly by the GPU performance.

CITATION LIST

Patent Literature

PTL 1: Japanese Unexamined Patent Application Publication No. 2006-30516

SUMMARY

Technical Problem

In a display device according to conventional technology, the duration (frame period) during which one screen's worth of data is displayed is set to be constant, and thus a duty ratio, which is the ratio of a light emission period to a frame period, is determined based on an estimated number of vertical lines. Then, the display device is controlled by a video image signal and a synchronization signal such that light emission is performed based on the duty ratio and a display is provided at pre-set light emission and light extinction timings.

However, because the frame period is variable depending on the content processed by the GPU, the frame period may vary significantly depending on the GPU's processing power, or the like. The duty ratio, which is the ratio of a light emission period to a frame period, varies as well according to the variation of the frame period. This causes a problem in that the pre-set light emission timing does not match the actual display timing, causing a flicker phenomenon in which fine flickering appears on the screen.

In view of the problem described above, it is an object of the present disclosure to provide a display panel control device, a display device, and a method for driving a display panel, with which it is possible to suppress a flicker phenomenon.

Solution to Problem

In order to achieve the object described above, a display panel control device according to one aspect of the present disclosure is a control device that controls display of a display panel including a plurality of pixel circuits that are arranged in rows and columns, the control device including: a data storing unit that temporarily stores a video image signal received from outside; a synchronization control unit that supplies the video image signal from the data storing unit to the display panel based on a vertical synchronization signal received from the outside or a start timing of the video image signal; and a duty control unit that outputs a light extinction signal for causing the display panel to extinguish light, and controls light emission and light extinction of the display panel. The synchronization control unit starts a frame period when the vertical synchronization signal is received or the start timing of the video image signal is detected, the frame period including: a light emission period during which the display panel is caused to emit light; and a light extinction period during which the display panel is caused to extinguish light. The duty control unit controls a length of the light extinction period, based on a ratio between a total number of vertical lines in a current frame and a pre-set minimum number of vertical lines in a video image displayed on the display panel during the frame period, such that a ratio between a length of the light emission period and a length of the light extinction period during the frame period when a video image is displayed with the total number of vertical lines in the current frame is constant.

With this configuration, the light extinction period and the light emission period can be adjusted such that the on-duty ratio when a video image is displayed with the minimum number of vertical lines and the on-duty ratio when a video image is displayed with the total number of vertical lines in the current frame are equal. Accordingly, it is possible to suppress a flicker phenomenon in the display panel.

Also, the duty control unit may include a duty computation unit that generates a gate waveform generation parameter for generating a waveform of a gate signal that is output from a gate driving circuit to the plurality of pixel circuits based on the ratio between the total number of vertical lines in the current frame and the minimum number of vertical lines.

With this configuration, a gate waveform generation parameter can be calculated based on the ratio between the total number of vertical lines in the current frame and the minimum number of vertical lines, and the light extinction period when a video image is displayed with the minimum number of vertical lines can be weighted by multiplying the light extinction period when a video image is displayed with the minimum number of vertical lines by the calculated gate waveform generation parameter. As a result, the ratio between the light emission period and the light extinction period when a video image is displayed with the minimum number of vertical lines and the ratio between the light emission period and the light extinction period when a video image is displayed with the total number of vertical lines in the current frame can be made equal. Accordingly, even if the frame period varies due to the GPU's processing power or the like, the control device can suppress a flicker phenomenon that occurs in the display panel.

Also, the gate waveform generation parameter may be represented by $V_{now}/V_{min}$, where $V_{min}$ is the minimum number of vertical lines, and $V_{now}$ is the total number of vertical lines in the current frame.

With this configuration, when the light emission control unit is notified of the total number of vertical lines in the current frame from the outside, the control device can easily calculate the gate waveform generation parameter based on the minimum number of vertical lines and the total number of vertical lines in the current frame. As a result, the control device can conveniently adjust the light emission luminance of the light emitting elements, and a flicker phenomenon that occurs in the display panel can be suppressed.

Also, the gate waveform generation parameter may be represented by $1+V_{diff}/V_{min}$, where $V_{min}$ is the minimum number of vertical lines, and $V_{diff}$ is a difference of the total number of vertical lines in the current frame to the minimum number of vertical lines.

With this configuration, even if the total number of vertical lines in the current frame is not supplied to the light emission control unit from the outside, if the difference between the minimum number of vertical lines and the total number of vertical lines in the current frame is supplied, the control device can adjust the light extinction period when a video image is displayed with a total number of vertical lines in the current frame. Also, the light extinction period can be adjusted by conveniently calculating the gate waveform generation parameter without using a complex division calculation.

Also, the duty control unit may include a storage unit that stores a plurality of the gate waveform generation parameters calculated in advance based on the total number of vertical lines in the current frame and the minimum number of vertical lines. The duty control unit may select, from the storage unit, one of the gate waveform generation parameters that corresponds to the minimum number of vertical lines and the total number of vertical lines in the current frame. When the video image is displayed with the total number of vertical lines in the current frame, the duty control unit may adjust the length of the light extinction period by performing calculation using the light extinction period in the frame period when a video image is displayed with the minimum number of vertical lines and the selected the gate waveform generation parameter.

With this configuration, the control device can easily adjust the light emission luminance of the light emitting elements when a video image is displayed with the total number of vertical lines in the current frame by selecting an optimal gate waveform generation parameter from the already calculated gate waveform generation parameters.

Also, the duty control unit may include: a sequencer that outputs a sequence of light emission and light extinction of the display panel; and a light emission control unit that controls the light emission and light extinction of the display panel based on the sequence output from the sequencer. The sequencer may divide the light extinction period into a plurality of light extinction periods according to the total number of vertical lines in the current frame and the minimum number of vertical lines, and arrange the plurality of divided light extinction periods at predetermined intervals in the frame period during which the video image is displayed with the total number of vertical lines in the current frame, The light emission control unit may output a light extinction signal for causing the display panel to extinguish light so as to correspond to each of the plurality of divided light extinction periods.

With this configuration, it is possible to display a video image with the total number of vertical lines in the current frame artificially as if it is displayed at the same frame rate as that when a video image is displayed with the minimum number of vertical lines. Accordingly, flickering does not appear on the screen even if the frame rate is changed, and thus the occurrence of the flicker phenomenon can be suppressed.

Also, one of the plurality of divided light extinction periods that is arranged at an end of the frame period may include an initialization period for initializing the plurality of pixel circuits.

With this configuration, by including the initialization period for initializing the plurality of pixel circuits in the light extinction period that is provided at the end of the frame period, it is possible to appropriately display a video image in the subsequent frame period.

Also, the sequencer may include: a light extinction period counter that counts the length of the light extinction period; a line counter that counts vertical lines; and a sequence control unit that generates a sequence for controlling division of the light extinction period and arrangement of the plurality of divided light extinction periods, based on count values of the light extinction period counter and the line counter.

With this configuration, a new sequence can be generated based on the count values of the light extinction period counter and the line counter, and thus an optimal display can be provided each time.

Also, in order to achieve the object described above, a display device according to one aspect of the present disclosure includes: a panel unit in which a plurality of pixel circuits that include light emitting elements are arranged in rows and columns; a source driving circuit that supplies a video image signal to the pixel circuits, the video image signal being a signal that is displayed on the panel unit; a gate driving circuit that supplies a synchronization signal to the pixel circuits, the synchronization signal being a signal for controlling a display timing of the video image signal displayed on the panel unit; and a control device that controls the gate driving circuit and the source driving circuit. The control device includes: a data storing unit that temporarily stores the video image signal received from outside; a synchronization control unit that supplies the video image signal from the data storing unit to the panel unit based on a vertical synchronization signal received from the outside or a start timing of the video image signal; and a duty control unit that outputs a light extinction signal for causing the panel unit to extinguish light, and controls light emission and light extinction of the panel unit. The synchronization control unit starts a frame period when the vertical synchronization signal is received, the frame period including: a light emission period during which the panel unit is caused to emit light; and a light extinction period during which the panel unit is caused to extinguish light. The duty control unit controls a length of the light extinction period, based on a ratio between a total number of vertical lines in a current frame and a pre-set minimum number of vertical lines in a video image displayed on the panel unit during the frame period, such that a ratio between a length of the light emission period and a length of the light extinction period during the frame period when a video image is displayed with the total number of vertical lines in the current frame is constant.

With this configuration, the light extinction period and the light emission period can be adjusted such that the on-duty ratio when a video image is displayed with the minimum number of vertical lines and the on-duty ratio when a video image is displayed with the total number of vertical lines in the current frame are equal. Accordingly, it is possible to suppress a flicker phenomenon in the panel unit.

Also, the duty control unit may include a duty computation unit that generates a gate waveform generation parameter for generating a waveform of a gate signal that is output from the gate driving circuit to the plurality of pixel circuits based on the ratio between the total number of vertical lines in the current frame and the minimum number of vertical lines.

With this configuration, a gate waveform generation parameter can be calculated based on the ratio between the total number of vertical lines in the current frame and the minimum number of vertical lines, and the light extinction period when a video image is displayed with the minimum number of vertical lines can be weighted by multiplying the light extinction period when a video image is displayed with the minimum number of vertical lines by the calculated gate waveform generation parameter. As a result, the ratio between the light emission period and the light extinction period when a video image is displayed with the minimum number of vertical lines and the ratio between the light emission period and the light extinction period when a video image is displayed with the total number of vertical lines in the current frame can be made equal. Accordingly, even if the frame period varies due to the GPU's processing power or the like, the control device can suppress a flicker phenomenon that occurs in the display panel.

Also, the gate waveform generation parameter may be represented by $V_{now}/V_{min}$, where $V_{min}$ is the minimum number of vertical lines, and $V_{now}$ is the total number of vertical lines in the current frame.

With this configuration, when the light emission control unit is notified of the total number of vertical lines in the current frame from the outside, the control device can easily calculate the gate waveform generation parameter based on the minimum number of vertical lines and the total number of vertical lines in the current frame. As a result, the control device can conveniently adjust the light emission luminance of the light emitting elements, and a flicker phenomenon that occurs in the display panel can be suppressed.

Also, the gate waveform generation parameter may be represented by $1+V_{diff}/V_{min}$, where $V_{min}$ is the minimum number of vertical lines, and $V_{diff}$ is a difference of the total number of vertical lines in the current frame to the minimum number of vertical lines.

With this configuration, even if the total number of vertical lines in the current frame is not supplied to the light emission control unit from the outside, if the difference between the minimum number of vertical lines and the total number of vertical lines in the current frame is supplied, the control device can adjust the light extinction period when a video image is displayed with a total number of vertical lines in the current frame. Also, the light extinction period can be adjusted by conveniently calculating the gate waveform generation parameter without using a complex division calculation.

Also, the duty control unit may include a storage unit that stores a plurality of the gate waveform generation parameters calculated in advance based on the total number of vertical lines in the current frame and the minimum number of vertical lines. The duty control unit may select, from the storage unit, one of the gate waveform generation parameters that corresponds to the minimum number of vertical lines and the total number of vertical lines in the current frame. When the video image is displayed with the total number of vertical lines in the current frame, the duty control unit may adjust the length of the light extinction period by performing calculation using the light extinction period in the frame period when a video image is displayed with the minimum number of vertical lines and the gate waveform generation parameter selected by the duty control unit.

With this configuration, the control device can easily adjust the light emission luminance of the light emitting elements when a video image is displayed with the total number of vertical lines in the current frame by selecting an optimal gate waveform generation parameter from the already calculated gate waveform generation parameters.

Also, the duty control unit may include: a sequencer that outputs a sequence of light emission and light extinction of the panel unit; and a light emission control unit that controls the light emission and light extinction of the panel unit based on the sequence output from the sequencer. The sequencer may divide the light extinction period into a plurality of light extinction periods according to the total number of vertical lines in the current frame and the minimum number of vertical lines, and arrange the plurality of divided light extinction periods at predetermined intervals in the frame period during which the video image is displayed with the total number of vertical lines in the current frame. The light emission control unit may output a light extinction signal for causing the panel unit to extinguish light so as to correspond to each of the plurality of divided light extinction periods.

With this configuration, it is possible to display a video image with the total number of vertical lines in the current frame artificially as if it is displayed at the same frame rate as that when a video image is displayed with the minimum number of vertical lines. Accordingly, flickering does not appear on the screen even if the frame rate is changed, and thus the occurrence of the flicker phenomenon can be suppressed.

Also, one of the plurality of divided light extinction periods that is arranged at an end of the frame period may include an initialization period for initializing the plurality of pixel circuits.

With this configuration, by including the initialization period for initializing the plurality of pixel circuits in the light extinction period that is provided at the end of the frame period, it is possible to appropriately display a video image in the subsequent frame period.

Also, the sequencer may include: a light extinction period counter that counts the length of the light extinction period; a line counter that counts vertical lines; and a sequence control unit that generates a sequence for controlling division of the light extinction period and arrangement of the plurality of divided light extinction periods, based on count values of the light extinction period counter and the line counter.

With this configuration, a new sequence can be generated based on the count values of the light extinction period counter and the line counter, and thus an optimal display can be provided each time.

Also, in order to achieve the object described above, a method for driving a display panel according to one aspect of the present disclosure is a method for driving a display panel including a plurality of pixel circuits that are arranged in rows and columns, the method including: starting a frame period when a vertical synchronization signal is received or a start timing of a video image signal is detected, the frame period including: a light emission period during which the display panel is caused to emit light; and a light extinction period during which the display panel is caused to extinguish light; initializing the pixel circuits based on reception of the vertical synchronization signal or the start timing of the video image signal; temporarily storing the video image signal in a data storing unit after the reception of the vertical synchronization signal or the detection of the start timing of the video image period signal; adjusting, by a duty control unit, a length of the light extinction period, based on a ratio between a total number of vertical lines in a current frame and a pre-set minimum number of vertical lines in a video image displayed on the display panel during the frame period, such that a ratio between a length of the light emission period and a length of the light extinction period during the frame period when a video image is displayed with the total number of vertical lines in the current frame is constant; and displaying the video image signal by causing light emitting elements to extinguish light during the adjusted light extinction period, and causing the light emitting elements to emit light during the light emission period other than the light extinction period in the frame period.

With this configuration, the light extinction period and the light emission period can be adjusted such that the on-duty ratio when a video image is displayed with a minimum number of vertical lines and the on-duty ratio when a video image is displayed with a total number of vertical lines in the current frame are equal. Accordingly, it is possible to suppress a flicker phenomenon in the display panel.

Also, the method may include: generating a gate waveform generation parameter for generating a waveform of a gate signal that is output from a gate driving circuit to the plurality of pixel circuits based on the ratio between the total number of vertical lines in the current frame and the minimum number of vertical lines that has been notified after the reception of the vertical synchronization signal or the detection of the start timing of the video image period signal. In the adjusting of the length of the light extinction period, the light extinction period may be adjusted by performing calculation using the light extinction period when a video image is displayed with the minimum number of vertical lines and the gate waveform generation parameter generated in the generating of the gate waveform generation parameter.

With this configuration, a gate waveform generation parameter can be calculated based on the ratio between the total number of vertical lines in the current frame and the minimum number of vertical lines, and the light extinction period when a video image is displayed with the minimum number of vertical lines can be weighted by multiplying the light extinction period when a video image is displayed with the minimum number of vertical lines by the calculated gate waveform generation parameter. As a result, the ratio between the light emission period and the light extinction period when a video image is displayed with the minimum number of vertical lines and the ratio between the light emission period and the light extinction period when a video image is displayed with the total number of vertical lines in the current frame can be made equal. Accordingly, even if the frame period varies due to the GPU's processing power or the like, the control device can suppress a flicker phenomenon that occurs in the display panel.

Also, the gate waveform generation parameter may be represented by $V_{now}/V_{min}$, where $V_{min}$ is the minimum number of vertical lines, and $V_{now}$ is the total number of vertical lines in the current frame.

With this configuration, when the light emission control unit is notified of the total number of vertical lines in the current frame from the outside, the control device can easily calculate the gate waveform generation parameter based on the minimum number of vertical lines and the total number of vertical lines in the current frame. As a result, the control device can conveniently adjust the light emission luminance of the light emitting elements, and a flicker phenomenon that occurs in the display panel can be suppressed.

Also, the gate waveform generation parameter may be represented by $1+V_{diff}/V_{min}$, where $V_{min}$ is the minimum number of vertical lines, and $V_{diff}$ is a difference of the total number of vertical lines in the current frame to the minimum number of vertical lines.

With this configuration, even if the total number of vertical lines in the current frame is not supplied to the light emission control unit from the outside, if the difference between the minimum number of vertical lines and the total number of vertical lines in the current frame is supplied, the control device can adjust the light extinction period when a video image is displayed with a total number of vertical lines in the current frame. Also, the light extinction period can be adjusted by conveniently calculating the gate waveform generation parameter without using a complex division calculation.

Also, in the generating of the gate waveform generation parameter, the gate waveform generation parameter may be selected from a storage unit that stores a plurality of the gate waveform generation parameters calculated in advance based on the minimum number of vertical lines and the total number of vertical lines in the current frame. In the adjusting of the length of the light extinction period, the length of the light extinction period may be adjusted by performing calculation using the light extinction period when a video image is displayed with the minimum number of vertical lines and the gate waveform generation parameter selected in the generating of the gate waveform generation parameter.

With this configuration, the control device can easily adjust the light emission luminance of the light emitting elements when a video image is displayed with the total number of vertical lines in the current frame by selecting an optimal gate waveform generation parameter from the already calculated gate waveform generation parameters.

Also, the method may include: in the adjusting of the length of the light extinction period, after the length of the light extinction period is adjusted by the duty control unit, dividing the adjusted light extinction period into a plurality of light extinction periods according to the total number of vertical lines in the current frame and the minimum number of vertical lines; and arranging the plurality of divided light extinction periods at predetermined intervals in the frame period during which the video image is displayed with the total number of vertical lines in the current frame.

With this configuration, it is possible to display a video image with the total number of vertical lines in the current frame artificially as if it is displayed at the same frame rate as that when a video image is displayed with the minimum number of vertical lines. Accordingly, flickering does not appear on the screen even if the frame rate is changed, and thus the occurrence of the flicker phenomenon can be suppressed.

Also, one of the plurality of divided light extinction periods that is arranged at an end of the frame period may include an initialization period for initializing the plurality of pixel circuits.

With this configuration, by including the initialization period for initializing the plurality of pixel circuits in the light extinction period that is provided at the end of the frame period, it is possible to appropriately display a video image in the subsequent frame period.

Advantageous Effects

With the display panel control device, the display device, and the method for driving a display panel according to the present disclosure, it is possible to suppress a flicker phenomenon.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 10 is a diagram showing an example of a light emission luminance table stored in the display device according to Embodiment 2.

DESCRIPTION OF EMBODIMENTS

Figure 1:
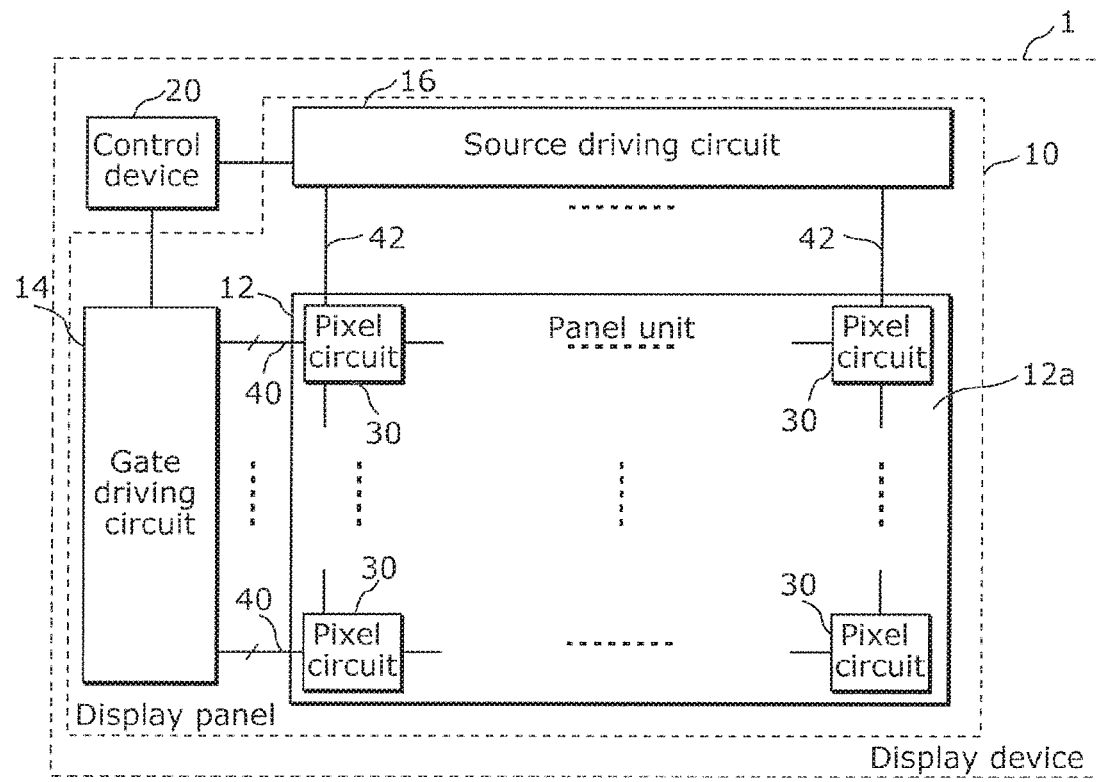
FIG. 1 is a schematic diagram showing an example of a configuration of a display device according to Embodiment 1.

Hereinafter, embodiments according to the present disclosure will be described. The embodiments described below are specific examples of the present disclosure. Accordingly, the numerical values, shapes, materials, structural elements, the arrangement and connection of the structural elements, steps, the order of the steps, and the like shown in the following embodiments are merely examples, and therefore are not intended to limit the scope of the present disclosure. Thus, among the structural elements described in the following embodiments, structural elements not recited in any one of the independent claims are described as arbitrary structural elements.

Also, the diagrams are schematic representations, and thus are not necessarily true to scale. In the diagrams, structural elements that are substantially the same are given the same reference numerals, and a redundant description is omitted or simplified.

Embodiment 1

Hereinafter, Embodiment 1 will be described with reference to FIGS. 1 to 8. The present embodiment will be described by taking a display device 1 that uses organic electroluminescent (EL) elements as an example of the display device according to the present disclosure.

1. Configuration of Display Device

Figure 2:
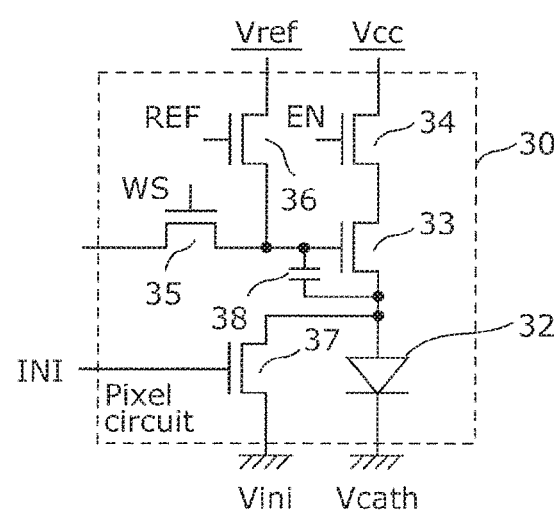
FIG. 2 is a circuit diagram showing a configuration of a pixel circuit according to Embodiment 1.
Figure 3:
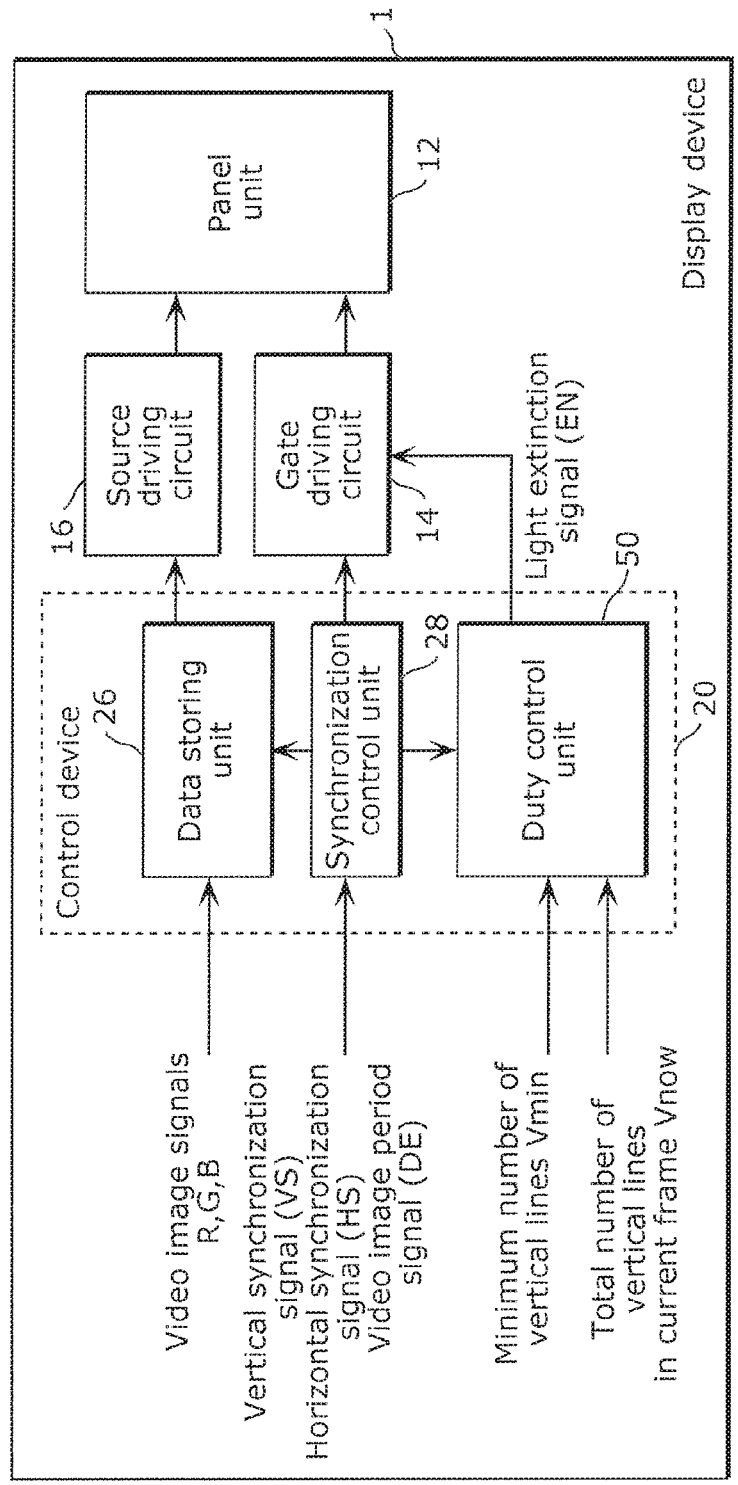
FIG. 3 is a block diagram showing a configuration of a display device according to Embodiment 1.

First, a configuration of a display device 1 will be described. FIG. 1 is a schematic diagram showing an example of a configuration of the display device 1 according to the present embodiment. FIG. 2 is a circuit diagram showing a configuration of a pixel circuit 30 according to the present embodiment. FIG. 3 is a block diagram showing a configuration of the display device 1 according to the present embodiment.

As shown in FIG. 1, the display device 1 includes a display panel 10, and a control device 20. The display panel 10 includes a panel unit 12, a gate driving circuit 14, a source driving circuit 16, scanning lines 40, and signal lines 42. The panel unit 12, the gate driving circuit 14, the source driving circuit 16, the scanning lines 40, and the signal lines 42 are mounted on, for example, a panel substrate 12a.

The panel unit 12 includes a panel substrate 12a that was mentioned above, a plurality of pixel circuits 30 that are arranged in rows and columns on the panel substrate 12a, scanning lines 40, and signal lines 42 that were also mentioned above. To be more specific, the panel unit 12 includes scanning lines 40 arranged in rows, signal lines 42 arranged in columns, and pixel circuits 30 each including a light emitting element 32 disposed at a portion where a scanning line and a signal line intersects. The panel substrate 12a is made of, for example, glass or a resin such as acrylic resin.

The plurality of pixel circuits 30 are formed on the panel substrate 12a by, for example, a semiconductor process. The plurality of pixel circuits 30 are arranged in, for example, N rows and M columns. The values N and M vary depending on the size and resolution of the display screen. For example, in the case where pixel circuits 30 corresponding to three primary colors of R, G, and B are provided side by side in a row at a resolution called a high definition (HD), N represents at least 1080 rows, and M represents at least 1920×3 columns. Each pixel circuit 30 includes an organic EL element as the light emitting element, and constitutes any one of the light emitting pixels of three primary colors of R, G, and B.

As shown in FIG. 2, a pixel circuit 30 includes a light emitting element 32, a driving transistor 33, a selection transistor 35, switch transistors 34, 36 and 37, and a pixel capacitor 38. A configuration and operations of the pixel circuit 30 will be described later in detail.

A scanning line 40 is provided for each row of the plurality of pixel circuits 30 that are arranged in rows and columns. One end of the scanning line 40 is connected to the output terminal of a corresponding stage of the gate driving circuit 14.

A signal line 42 is provided for each column of the plurality of pixel circuits 30 that are arranged in rows and columns. One end of the signal line 42 is connected to the output terminal of a corresponding stage of the source driving circuit 16.

The gate driving circuit 14 is a driving circuit that is also called "row driving circuit" and that scans a gate driving signal per row of the pixel circuits 30. The gate driving signal is a signal that is input into the gates of the driving transistor 33, the selection transistor 35, and the switch transistors 34, 36 and 37 of each pixel circuit 30 so as to perform control to turn each transistor on and off. The gate driving circuit 14 outputs, for example, a control signal WS, a light extinction signal EN, a control signal REF, and a control signal INI as the signals for controlling the selection transistor 35, and the switch transistors 34, 36 and 37. Also, as shown in FIG. 1, the gate driving circuit 14 is provided on one of the short sides of the panel unit 12.

The gate driving circuit 14 is, for example, a shift register, or the like. In response to receiving a video image period signal DE from the control device 20, the gate driving circuit 14 outputs a gate driving signal in synchronization with a vertical synchronization signal VS that is also provided from the control device 20, and drives the scanning lines 40. As a result, pixel circuits 30 are line sequentially selected for each frame, and the light emitting elements 32 of the pixel circuits 30 emit light at a luminance according to the video image signal.

As shown in FIG. 1, the gate driving circuit 14 may be provided on one of the short sides of the panel unit 12, or may be provided on each of the opposing short sides of the panel unit 12. As a result of the gate driving circuit 14 being provided on each of the opposing short sides of the panel unit 12, it is possible to supply the same gate driving signal to the plurality of pixel circuits 30 that are disposed on the panel unit 12 at the same timing. Accordingly, for example, if the panel unit 12 is large-sized, it is possible to suppress a signal degradation caused by the interconnect capacitance of the scanning lines 40.

The source driving circuit 16 is a driving circuit that is also called "column driving circuit" and that supplies a video image signal that is supplied per frame from the control device 20 to each pixel circuit 30. The source driving circuit 16 is provided on one of the long sides of the panel unit 12.

The source driving circuit 16 is a current writing type or voltage writing type driving circuit that writes luminance information based on the video image signal into each pixel circuit 30 in the form of a current value or a voltage value through the signal lines 42. As the source driving circuit 16 according to the present embodiment, for example, a voltage writing type driving circuit is used. The source driving circuit 16 supplies a voltage that represents the brightness of the light emitting element 32 provided in each pixel circuit 30 to the signal lines 42 based on the video image signal input from the control device 20.

The video image signal input from the control device 20 to the source driving circuit 16 includes, for example, digital serial data of each of three primary colors of R, G, and B (video image signals R, G, and B). The video image signals R, G, and B input to the source driving circuit 16 are converted to parallel data per row within the source driving circuit 16. Furthermore, the parallel data per row is converted to analog data per row within the source driving circuit 16, which is then output to the corresponding signal line 42. The voltage output to the signal line 42 is written into the pixel capacitors 38 of the pixel circuits 30 that belong to the row selected through scanning performed by the gate driving circuit 14. That is, an electric charge corresponding to the voltage output to the signal line 42 is accumulated in the pixel capacitors 38.

As shown in FIG. 1, the source driving circuit 16 may be provided on one of the long sides of the panel unit 12, or may be provided on each of the opposing long sides of the panel unit 12. With this configuration, for example, if the panel unit 12 is large-sized, it is possible to output voltage to the pixel circuits 30 of the same column at the same timing.

2. Configuration of Pixel Circuit

As shown in FIG. 2, a pixel circuit 30 includes a light emitting element 32, a driving transistor 33, a selection transistor 35, switch transistors 34, 36 and 37, and a pixel capacitor 38.

The light emitting element 32 is, for example, a diode-type organic EL element that includes an anode and a cathode. The light emitting element 32 is not limited to an organic EL element, and may be any other light emitting element. For example, the light emitting element 32 can be any ordinary element that is current-driven and emits light.

The light emitting element 32 includes; for example, a plurality of first electrode layers that are made of transparent conductive films; an organic layer in which a positive hole transport layer, a light emission layer, an electron transport layer, and an electron injection layer are deposited in this order on the first electrode layers; and a second electrode layer that is made of a metal film and is provided on the organic layer. In FIG. 2, the light emitting element 32 is schematically indicated by a symbol. When a direct current voltage is applied between the first electrode layers and the second electrode layer of the light emitting element 32, recombination of electrons and positive holes takes place in the light emission layer. As a result, due to the drain-to-source current of the driving transistor 33 supplied from the driving transistor 33, the light emitting element 32 emits light at a luminance according to the signal potential of the video image signal.

The driving transistor 33 is an active element that drives the light emitting element 32 to emit light. The driving transistor 33 supplies the drain-to-source current that corresponds to the gate-to-source voltage to the light emitting element 32 by being turned on.

The switch transistor 34 is turned on or off according to the light extinction signal EN supplied from the scanning line 40. The switch transistor 34 connects the driving transistor 33 to a power supply Vcc by being turned on, and the drain-to-source current of the driving transistor 33 is supplied to the light emitting element 32.

The selection transistor 35 is turned on according to the control signal WS supplied from the scanning line 40, and an electric charge corresponding to the signal potential of the video image signal supplied from the signal line 42 is accumulated in the pixel capacitor 38.

The switch transistor 35 is turned on according to the control signal REF supplied from the scanning line 40, and sets the gate of the driving transistor 33 to a reference voltage Vref.

The switch transistor 37 is turned on according to the control signal INI supplied from the scanning line 40, and sets the source of the driving transistor 33 to a reference voltage Vini.

The pixel capacitor 38 applies a voltage to the gate of the driving transistor 33 according to the signal potential based on the accumulated electric charge.

The driving transistor 33, the selection transistor 35, the switch transistor 36, and the switch transistor 37 are, for example, N channel type polysilicon TFTs (Thin Film Transistors). Also, the switch transistor 34 is, for example, a P channel type polysilicon TFT. The conductivity type of the transistors is not limited to the above, and N channel type and P channel type TFTs may be mixed as appropriate. Also, the transistors are not limited to polysilicon TFTs, and may be amorphous silicon TFTs, or the like.

Operations performed by the pixel circuit 30 will now be described. Immediately before a frame period starts, all of the control signals WS, REF, and INI as well as the light extinction signal EN are at a low level. In this state, the selection transistor 35, the switch transistor 36, and the switch transistor 37 that are N channel type transistors are turned off. On the other hand, the switch transistor 34 that is a P channel type transistor is turned on.

Accordingly, the driving transistor 33 is connected to the power supply Vcc via the switch transistor 34 that is in an on-state. As a result, the driving transistor 33 supplies the drain-to-source current to the light emitting element 32 according to the gate-to-source voltage of the driving transistor 33. At this time, the light emitting element 32 emits light.

When the frame period starts, the light extinction signal EN is switched from the low level to a high level. In response thereto, the switch transistor 34 is turned off, and the driving transistor 33 is disconnected from the power supply Vcc. Accordingly, the light emitting element 32 stops emitting light, and a light extinction period starts. Also, all of the selection transistor 35, the switch transistor 36, the switch transistor 37, and the switch transistor 34 are turned off.

During an initialization period, first, the reference voltage Vref is changed to a voltage at which the driving transistor 33 is turned off when the control signal REF is set to a high level. Next, the control signal REF is set to a high level, and the switch transistor 36 is turned on. In response thereto, the gate of the driving transistor 33 is connected to the reference voltage Vref, and the driving transistor 33 is turned off. When the driving transistor 33 is turned off, the control signal REF is again set to a low level, and the switch transistor 36 is turned off. Furthermore, the reference voltage Vref is brought back to the original voltage.

Next, the control signal TNT is set to a high level, and the switch transistor 37 is turned on. In response thereto, the source of the driving transistor 33 is initialized to the reference voltage Vini. Then, when the control signal REF is set to a high level, the switch transistor 36 is turned on. In response thereto, the gate of the driving transistor 33 is initialized to the reference voltage Vref. As a result, the gate of the driving transistor 33 is connected to the reference voltage Vref, and the source is connected to the reference voltage Vini.

Here, the reference voltage Vref, the reference voltage Vini, and a threshold voltage Vth of the driving transistor 33 may satisfy the relationship: Vref−Vini>Vth. By doing so, the threshold voltage Vth of the driving transistor 33 can be corrected later. Also, by setting a threshold voltage of the light emitting element 32 to be greater than the reference voltage Vini, a minus bias is applied to the light emitting element 32, and the light emitting element 32 is brought into a so-called reverse bias state.

When the initialization period ends, the threshold voltage Vth of the driving transistor 33 is detected, and the threshold voltage Vth is corrected if necessary (Vth correction period). After the control signal INT is set to a low level, the light extinction signal EN is set to a low level. In response thereto, the switch transistor 37 is turned off, and the switch transistor 34 is turned on. Then, the drain-to-source current of the driving transistor 33 flows through the pixel capacitor 38, and the correction of the threshold voltage Vth is performed.

At this time, the gate of the driving transistor 33 is held at the reference voltage Vref, and the drain-to-source current of the driving transistor 33 flows through the driving transistor 33 until the driving transistor 33 is cut off. When the driving transistor 33 is cut off, the source of the driving transistor 33 has a potential Vref−Vth.

Then, the light extinction signal EN is again set to a high level, and the switch transistor 34 is turned off. Furthermore, the control signal REF is set to a low level, and the switch transistor 36 is turned off. The threshold voltage Vth is thereby held in the pixel capacitor 38.

Subsequently, the control signal WS is set from the low level to a high level. As a result, the signal potential of the video image signal is written into the pixel capacitor 38. Furthermore, the light extinction signal EN is set from the high level to a low level. The light emitting element 32 thereby starts emitting light.

By repeating the frame period described above, the light emitting elements 32 that are arranged in rows and columns sequentially emit light according to the signal potential of the video image signal, and a video image is displayed on the panel unit 12.

3. Configuration of Control Device

Next, a configuration of the control device 20 will be described.

The control device 20 is formed on an external system circuit substrate (not shown) provided outside the display panel 10. The control device 20 functions as, for example, a TCON (Timing Controller), and controls the overall operations of the display device 1. To be specific, the control device 20 provides an instruction to perform scanning to the gate driving circuit 14 according to a vertical synchronization signal VS, a horizontal synchronization signal HS, and a video image period signal DE that are supplied from the outside, Also, the control device 20 supplies digital serial data of video image signals R, G, and B to the source driving circuit 16.

As shown in FIG. 3, the control device 20 includes a data storing unit 26, a synchronization control unit 28, and a duty control unit 50. The control device 20 may include a receiver (not shown) that receives a signal supplied from the outside and supplies the signal to the data storing unit 26, the synchronization control unit 28, and the duty control unit 50.

The data storing unit 26 is a buffer that temporarily stores the video image signals R, G, and B. The data storing unit 26 includes, for example, 100 line buffers. The data storing unit 26 sequentially stores the video image signals R, G, and B for each line received from the outside, and outputs the video image signals to the source driving circuit 16 at a predetermined timing.

The synchronization control unit 28 is a control unit that controls the timing at which the video image signals R, G, and B are displayed on the panel unit 12. The synchronization control unit 28 receives a vertical synchronization signal VS, a horizontal synchronization signal HS, and a video image period signal DE from the outside, and outputs the signals to the gate driving circuit 14 and the source driving circuit 16. Also, the synchronization control unit 28 outputs, to the duty control unit 50, a count trigger for starting light extinction period calculation, which will be described later. At this time, the synchronization control unit 28 may also output, to the duty control unit 50, count triggers for starting counting a video image period, a light extinction period, a light emission period, and other periods.

Figure 4:
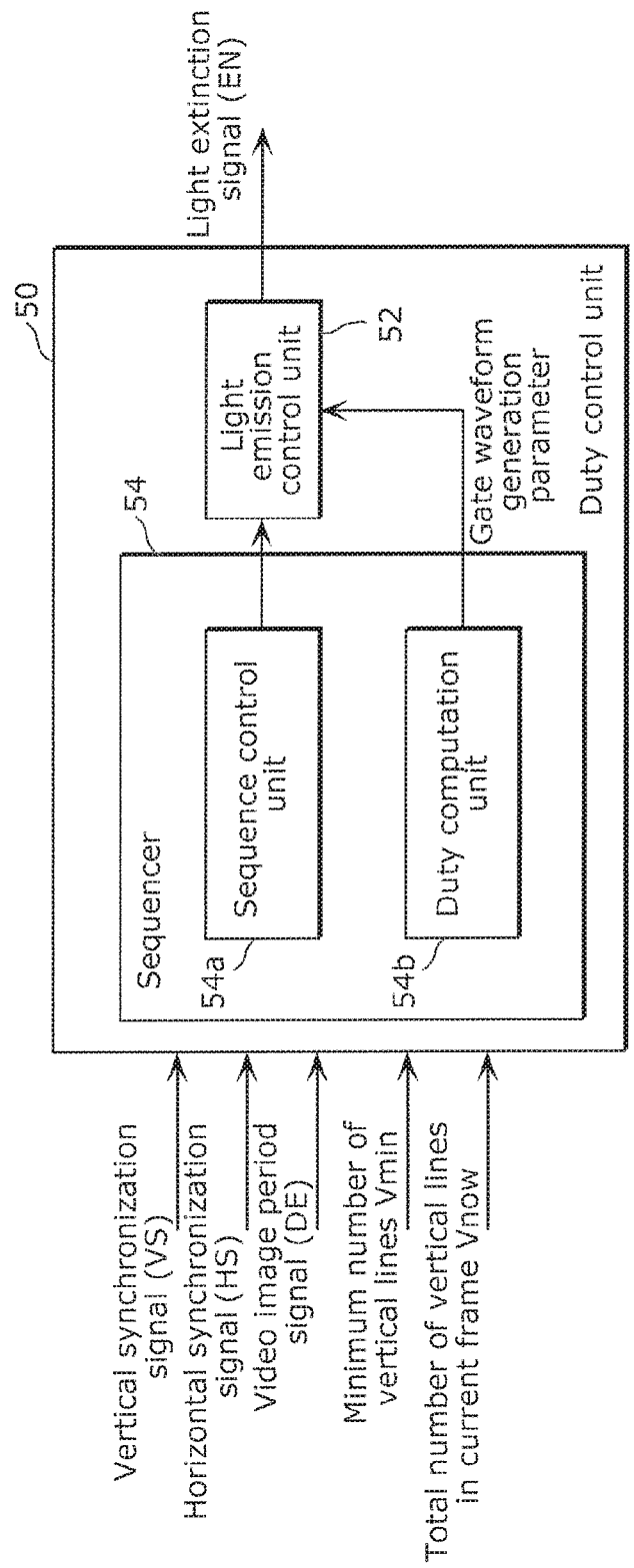
FIG. 4 is a block diagram showing a configuration of a duty control unit according to Embodiment 1.

FIG. 4 is a block diagram showing a configuration of the duty control unit 50 according to the present embodiment. The duty control unit 50 is a control unit that controls the gate driving circuit 14 and the source driving circuit 16 such that the video image signals R, G, and B are displayed on the panel unit 12 at a desired timing.

As shown in FIG. 4, the duty control unit 50 includes a light emission control unit 52, and a sequencer 54. In the duty control unit 50, the sequencer 4 sets the duty ratio of a light emission period to a light extinction period within one frame according to the video image period signal DE, and the light emission control unit 52 causes each light emitting element 32 to emit or extinguish light according to the set duty ratio.

The light emission control unit 52 is a control unit that controls light emission and light extinction of the light emitting elements 32. The light emission control unit 52 generates a light extinction signal EN based on a sequence output from a sequence control unit 54a included in the sequencer 54 and a gate waveform generation parameter calculated in a duty computation unit 54b included in the sequencer 54, and supplies the light extinction signal EN to the gate driving circuit 14. As a result, the gate driving circuit 14 supplies or stops supplying the light extinction signal EN to the switch transistor 34 of each pixel circuit 30 based on the sequence output from the sequencer 54, and controls light emission and light extinction of each light emitting element 32.

The sequencer 54 includes the sequence control unit 54a and the duty computation unit 54b.

The sequence control unit 54a generates a sequence for controlling the display timing of the video image signals R, G, and B based on the vertical synchronization signal VS, the horizontal synchronization signal HS, and the video image period signal DE that are supplied from the outside. The sequencer 54 may include, for example, counters that acquire the lengths of the video image period, the light extinction period, the light emission period, and any other periods as count values, other than the sequence control unit 54a and the duty computation unit 54b. In this case, the counters are, for example, timers, and start counting by count triggers supplied from the synchronization control unit 28.

The duty computation unit 54b is a computation unit that calculates a gate waveform generation parameter for adjusting the length of the light emission period and the length of the light extinction period in each frame period according to the frame rate, or in other words, the total number of vertical lines during one frame period. The duty computation unit 54b calculates the gate waveform generation parameter such that the ratio of the length of the light emission period to the length of the light extinction period in each frame is constant. To be specific, the duty computation unit 54b calculates a gate waveform generation parameter for adjusting the ratio of the length of the light emission period to the length of the light extinction period in the current frame based on a minimum number $V_{min}$ of vertical lines required to render one frame and a total number $V_{now}$ of vertical lines in the current frame that are supplied from the outside. The gate waveform generation parameter calculated by the duty computation unit 54b is supplied to the light emission control unit 52 from the duty computation unit 54b. A specific method for calculating the gate waveform generation parameter will be described later in detail.

The sequence (timing chart) generated by the sequence control unit 54a will be described later in detail.

4. Operations of Control Device

A description will now be given of operations performed in the control device 20 according to the present embodiment.

The display device 1 according to the present embodiment is driven by, for example, a progressive driving scheme for organic EL light emitting panels. To be specific, the control device 20 performs control so as to cause the panel unit 12 in which a plurality of pixel circuits 30 are arranged in rows and columns to perform an initialization operation, a write operation, and a light emission operation in a row-sequential manner. That is, under the control of the control device 20, an initialization operation, a write operation, and a light emission operation are sequentially performed from the first row to the last row in the panel unit 12. This period will be referred to as a "frame period". The frame period may include a threshold voltage Vth detection operation of detecting the threshold voltage Vth of the driving transistor 33, and the like, in addition to the initialization operation, the write operation, and the light emission operation.

Figure 5:
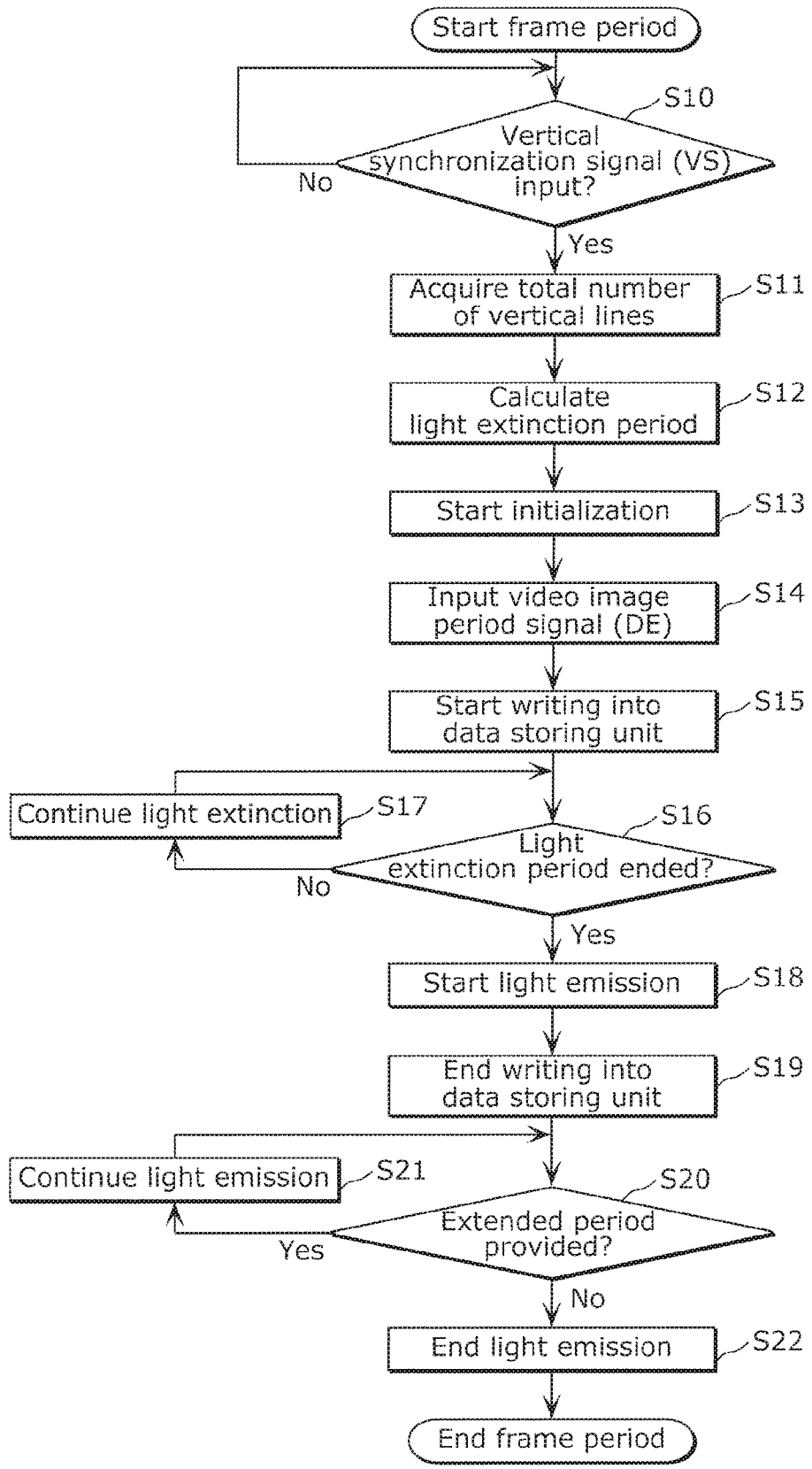
FIG. 5 is a flowchart illustrating operations performed during one frame period in a control device according to Embodiment 1.
Figure 6:
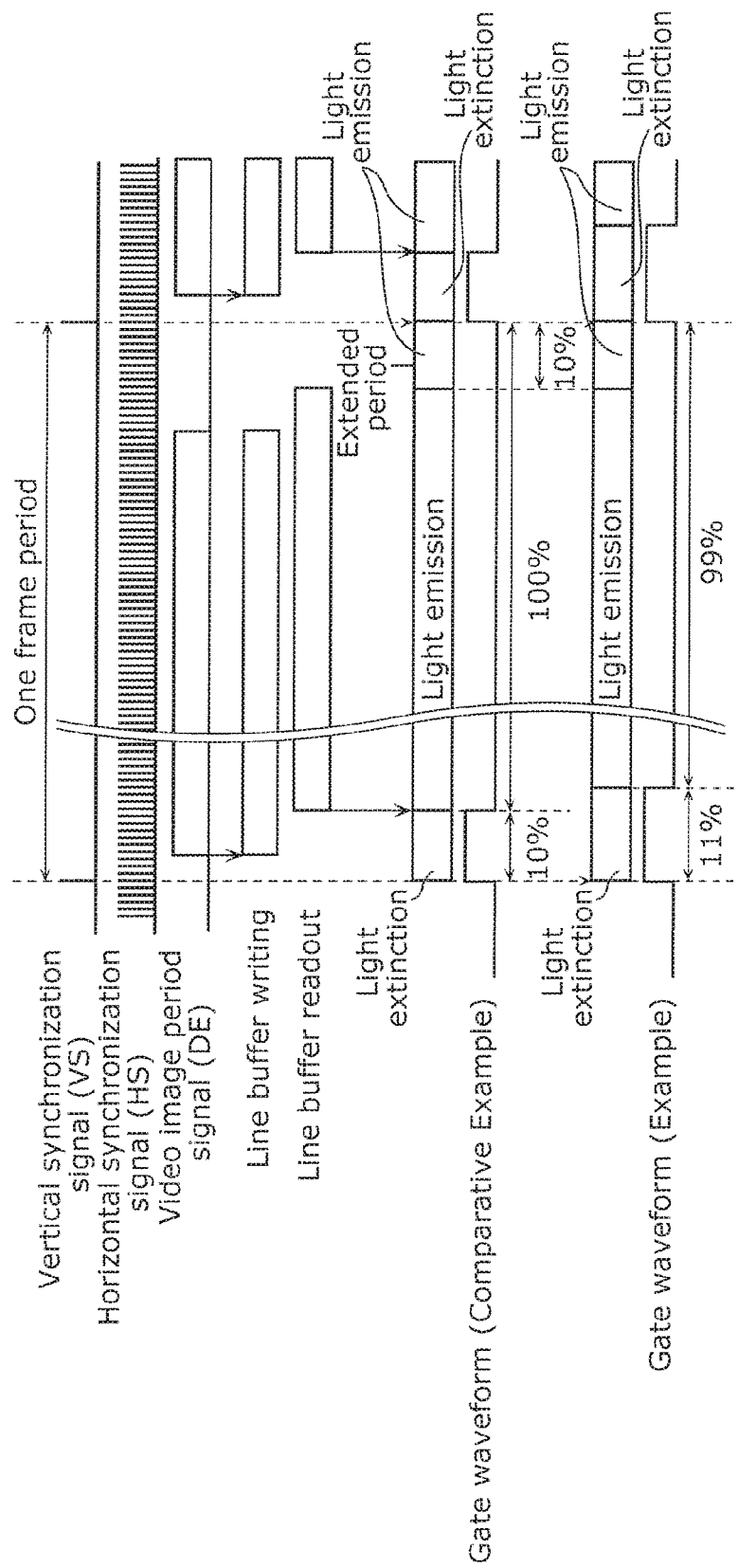
FIG. 6 is a timing chart schematically illustrating operations performed in the control device according to Embodiment 1.

Here, a feature of the operations performed in the control device 20 according to the present embodiment will be described. FIG. 5 is a flowchart illustrating operations performed during one frame period in the control device 20 according to the present embodiment. FIG. 6 is a timing chart schematically illustrating operations performed in the control device 20 according to the present embodiment. FIG. 6 shows the operations of one line's worth of pixel circuits 30 in the panel unit 12.

In the example given below, operations performed in the case where the on-duty ratio is 90% will be described. In the following description, as a comparative example, a frame period is set such that one frame period (video image period) is set to a period of 100 pulses of the horizontal synchronization signal, the light extinction period (initialization period) is set to a period of 10 pulses of the horizontal synchronization signal, and the light emission period is set to a period of 90 pulses of the horizontal synchronization signal. Also, as an inventive example, a frame period is set such that the length of the frame period is extended by 10% of the length of the frame period according to the comparative example.

As shown in FIGS. 5 and 6, first, in the control device 20, it is detected whether or not a vertical synchronization signal VS has been input from the outside (step S10). The vertical synchronization signal VS is supplied to the synchronization control unit 28 of the control device 20 from the outside. The vertical synchronization signal VS supplied to the synchronization control unit 28 is input from the synchronization control unit 28 to the duty control unit 50. In response thereto (Yes in step S10), a video image period is started. If the vertical synchronization signal VS is not input from the synchronization control unit 28 to the duty control unit 50 (No in step S10), a video image period is not started, and it is detected whether or not the vertical synchronization signal VS has been again input to the control device 20 from the outside.

Subsequently, the duty control unit 50 is notified of the total number of vertical lines in each frame period from the outside (step S11). The total number of vertical lines is notified to the duty control unit 50 immediately after the vertical synchronization signal VS has been supplied to the synchronization control unit 28. The total number of vertical lines that is notified includes a minimum number $V_{min}$ of vertical lines required to render one frame and a total number $V_{now}$ of vertical lines in the current frame. The minimum number $V_{min}$ of vertical lines is, for example, 1080 lines in the case of FH© resolution, and 2160 lines in the case of 4K UHD resolution. The minimum number $V_{min}$ of vertical lines is the same throughout the frames.

Next, in the duty computation unit 54b, a light extinction period that is included in one frame period is calculated (step S12), and a gate waveform generation parameter for causing the light emitting elements 32 to extinguish light during the calculated light extinction period is derived (parameter deriving step). As will be described later, the gate waveform generation parameter is derived from the minimum number $V_{min}$ of vertical lines required to render one frame and the total number $V_{now}$ of vertical lines in the current frame that were notified. The derived gate waveform generation parameter is output to the light emission control unit 52. Then, in steps S13 to S22, which will be described later, with respect to the sequence generated by the sequence control unit 54a, the light emission control unit 52 multiplies the light extinction period and the light emission period when a video image is displayed with the minimum number $V_{min}$ of vertical by the gate waveform generation parameter. Then, based on the light extinction period and the light emission period with which the gate waveform generation parameter has been multiplied, a light extinction signal EN is generated (light extinction period adjusting step). The method for deriving the gate waveform generation parameter will be described later in detail.

Also, when the vertical synchronization signal VS is output from the synchronization control unit 28, and the duty control unit 50 receives the vertical synchronization signal VS, the light extinction signal EN is supplied from the duty control unit 50 to the gate driving circuit 14. The light extinction signal EN is supplied from the gate driving circuit 14 to the gate of the switch transistor 34 of the pixel circuit 30. In response thereto, the switch transistor 34 is turned off, and the light emitting element 32 enters a light extinguishing state.

Then, an initialization period is started (step S13). The initialization period is performed based on a start timing of the vertical synchronization signal VS or the video image period signal DE received by the duty control unit 50. The start timing of the initialization period is not limited to when the duty control unit 50 receives the vertical synchronization signal VS, and may be when the duty control unit 50 detects a timing at which the input of the video image period signal DE is started. Also, the initialization period may be started when a predetermined period passes after the duty control unit 50 receives the vertical synchronization signal VS, or when a predetermined period passes after the duty control unit 50 detects a timing at which the input of the video image period signal DE is started. Also, the initialization period may be provided so as to straddle two consecutive frames.

Figure 7:
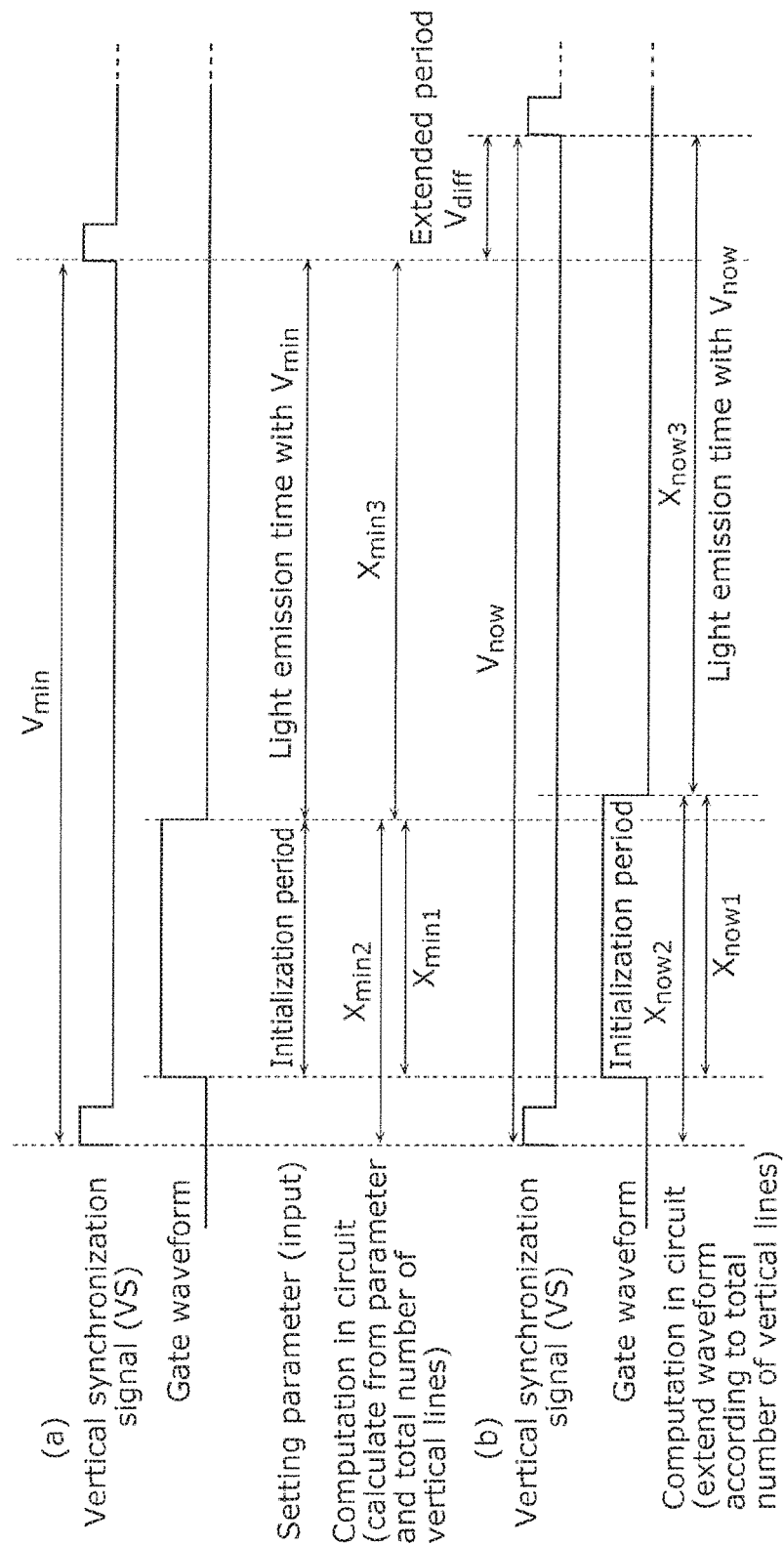
FIG. 7 is a diagram illustrating the calculation of a light extinction period performed in the control device according to Embodiment 1, with (a) showing an example when a video image is displayed with a minimum number of vertical lines, and (b) showing an example when a video image is displayed with a total number of vertical lines in a current frame.

During the initialization period, a gate signal for initialization is supplied from the gate driving circuit 14 to each pixel circuit 30 in the panel unit 12. In response thereto, the transistors of each pixel circuit 30 operate as described above, and the pixel circuit 30 is initialized (initialization step). During the initialization period, the light emitting element 32 is in a light extinguishing state, but as shown in FIG. 7, which will be described later, the light emitting element 32 may be in a light extinguishing state for a predetermined period between when the supply of the gate signal is stopped and the initialization period ends and when the next vertical synchronization signal VS is supplied.

A video image period signal DE is also supplied to the synchronization control unit 28 of the control device 20 from the outside (step S14). The supply of the video image period signal DE may be performed during the initialization period, or may be performed after the end of the initialization period. Here, it is assumed that the video image period signal DE is supplied during the initialization period.

When the video image period signal DE is supplied to the synchronization control unit 28, the writing of the video image signal is started (step S15). In response to the input of the video image period signal DE, the video image signal output from the source driving circuit 16 is temporarily written into the data storing unit 26 (writing step). The writing of the video image signal is continued while the video image period signal DE is supplied. The start timing of the writing step is not limited to when the input of the video image period signal DE into the synchronization control unit 28 is started, and may be when the duty control unit 50 receives the vertical synchronization signal VS.

When a predetermined period passes from the start of initialization, and one line's worth of pixel circuits 30 are initialized, the initialization period ends. The initialization period may end when the light extinction period for initialization reaches a pre-set period. At this time, it is detected whether or not the light extinction period calculated by the duty computation unit 54b has passed (step S16). If the light extinction period calculated by the duty computation unit 54b has not passed (No in step S16), the light extinction period is continued (step S17). If, on the other hand, the light extinction period calculated by the duty computation unit 54b has passed, the light extinction period is ended (Yes in step S16), and a light emission period is started (step S18). Whether or not the light extinction period has reached the termination period may be determined by determining whether a counter (not shown) included in the sequencer 54 has counted a predetermined count value.

When a light emission period is started, the readout of the video image signal from the data storing unit 26 is started (readout step). Also, the supply of the light extinction signal EN from the gate driving circuit 14 to the pixel circuit 30 is stopped, and thus the supply of the light extinction signal EN to the gate of the switch transistor 34 is stopped, and the switch transistor 34 is turned on. In response thereto, the light emitting element 32 emits light.

The light emitting element 32 emits light according to the video image signal readout from the data storing unit 26. The video image signal readout from the data storing unit 26 is supplied to the source driving circuit 16. The source driving circuit 16 causes the light emitting element 32 of each pixel circuit 30 in the panel unit 12 to emit light based on the supplied video image signal. The video image signal is thereby displayed on the panel unit 12 (video image display step).

Also, when the supply of the video image period signal DE is stopped, the writing of the video image signal into the data storing unit 26 ends (step S19).

Here, if the total number of vertical lines in the current frame notified from the outside is greater than the minimum number of vertical lines, and an extended period is provided (Yes in step S20), the light emission of the light emitting element 32 is continued (step S21).

If, on the other hand, an extended period is not provided (No in step S20), the light extinction signal EN is again supplied from the gate driving circuit 14 to each pixel circuit 30. In response thereto, the light emission of the light emitting element 32 during one frame period ends (step S22).

Here, in the case where the on-duty ratio is 90%, for example, one frame period (video image period) when a video image is displayed with the minimum number $V_{min}$ of vertical lines is set to a period of 100 pulses of the horizontal synchronization signal, and the light extinction period (initialization period) is set to a period of 10 pulses of the horizontal synchronization signal, and the light emission period is set to a period of 90 pulses of the horizontal synchronization signal. At this time, if it is assumed that one frame period when a video image is displayed with the total number $V_{now}$ of vertical lines in the current frame is extended by 10% of one frame period when a video image is displayed with the minimum number $V_{min}$ of vertical lines, one frame period is equal to a period of 110 pulses of the horizontal synchronization signal, which is extended by an amount corresponding to 10 pulses of the horizontal synchronization period as compared with when a video image is displayed with the minimum number $V_{min}$ of vertical lines.

If one frame period is longer than that when a video image is displayed with the minimum number $V_{min}$ of vertical lines, in an ordinary display device, the extended period is used as a light emission period or light extinction period, and thus the on-duty ratio in one frame period may be different from the on-duty ratio when a video image is displayed with the minimum number $V_{min}$ of vertical lines. For example, as indicated by Gate waveform (Comparative Example) shown in FIG. 6, during one frame period that has 110 pulses, a period of 10 pulses (10% of one frame period when a video image is displayed with the minimum number $V_{min}$ of vertical lines) is used as a light extinction period, and a period of 100 pulses (100% of one frame period when a video image is displayed with the minimum number $V_{min}$ of vertical lines) is used as a light emission period. In this case, the on-duty ratio in one frame period is as follows: 100/110=90.9%. As a result, the light emission time during one frame period increases, and thus a flicker phenomenon occurs.

In contrast, when a video image is displayed with the total number $V_{now}$ of vertical lines in the current frame, in the control device 20 according to the present embodiment, as described above, the light extinction period and the light emission period when a video image is displayed with the minimum number $V_{min}$ of vertical lines are multiplied by the gate waveform generation parameter. As a result, as indicated by Gate waveform (Example) shown in FIG. 6, during one frame period that has 110 pulses, a period of 11 pulses (11% of one frame period when a video image is displayed with the minimum number $V_{min}$ of vertical lines) is used as a light extinction period, and a period of 99 pulses (99% of one frame period when a video image is displayed with the minimum number $V_{min}$ of vertical lines) is used as a light emission period. Accordingly, the on-duty ratio in one frame period is as follows: 99/110=90%. Thus, with the control device 20 according to the present embodiment, when a video image is displayed with the total number $V_{now}$ of vertical lines in the current frame, the video image can be displayed at the same on-duty ratio as that when a video image is displayed with the minimum number $V_{min}$ of vertical lines. Accordingly, the occurrence of a flicker phenomenon can be suppressed.

[5. Calculation of Gate Waveform Generation Parameter]

Figure 8:
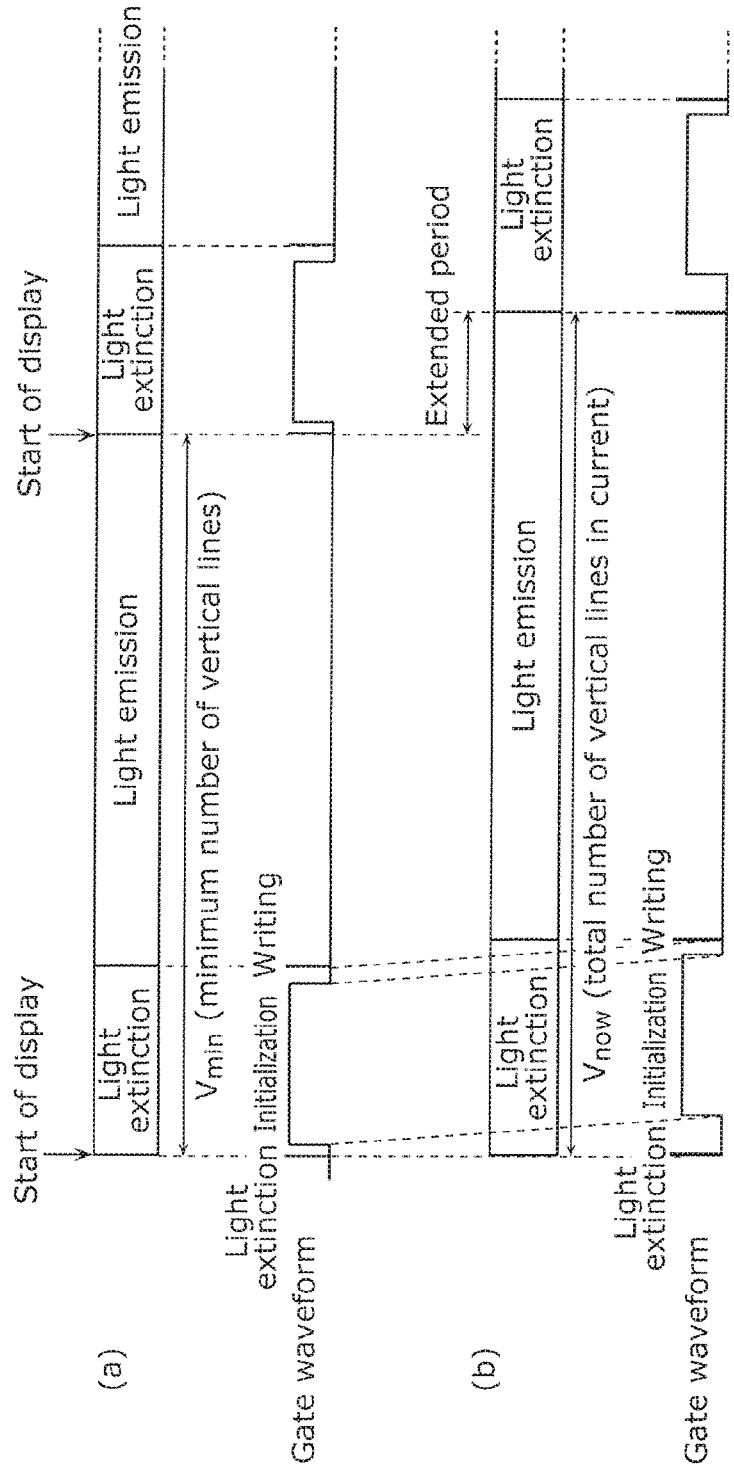
FIG. 8 is a diagram illustrating a feature of the operations performed in the control device according to Embodiment 1 when an initialization period is constant, with (a) showing an example when a video image is displayed with the minimum number of vertical lines, and (b) showing an example when a video image is displayed with the total number of vertical lines in the current frame.

Hereinafter, the method for calculating a gate waveform generation parameter will be described. FIG. 7 is a diagram illustrating the calculation of a light extinction period performed in the control device 20 according to the present embodiment, with (a) showing an example when a video image is displayed with the minimum number $V_{min}$ of vertical lines, and (b) showing an example when a video image is displayed with the total number $V_{now}$ of vertical lines in the current frame. FIG. 8 is a diagram illustrating a feature of the operations performed in the control device 20 according to the present embodiment when the initialization period is constant, with (a) showing an example when a video image is displayed with the minimum number $V_{min}$ of vertical lines, and (b) showing an example when a video image is displayed with the total number $V_{now}$ of vertical lines in the current frame. FIGS. 7 and 8 show the operations of one line's worth of pixel circuits 30 in the panel unit 12.

Also, $X_{min1}$, $X_{min2}$, and $X_{min3}$ shown in (a) in FIG. 7 respectively represent the initialization period, the light extinction period, and the light emission period when a video image is displayed with the minimum number $V_{min}$ of vertical lines. Likewise, $X_{now1}$, $X_{now2}$, and $X_{now3}$ shown in (b) in FIG. 7 respectively represent the initialization period, the light extinction period, and the light emission period when a video image is displayed with the total number $V_{now}$ of vertical lines in the current frame. Also, hereinafter, $X_{min1}$, $X_{min2}$, and $X_{min3}$ will be collectively referred to as $X_{min}$, and $X_{now1}$, $X_{now2}$, and $X_{now3}$ will be collectively referred to as $X_{now}$.

As described above, the duty control unit 50 adjusts the light emission period and the light extinction period such that the on-duty ratio in one frame period when a video image is displayed with the total number $V_{now}$ of vertical lines in the current frame is equal to the on-duty ratio in one frame period when a video image is displayed with the minimum number $V_{min}$ of vertical lines.

To be specific, the light emission control unit 52 weights the light extinction or light emission period ($X_{min}$) when a video image is displayed with the minimum number $V_{min}$ of vertical lines by multiplying the light extinction period and the light emission period when a video image is displayed with the minimum number $V_{min}$ of vertical lines by a gate waveform generation parameter. Then, with the weighted light extinction or light emission period ($X_{now}$), the light emitting element 32 is caused to emit light. That is, the light emitting element 32 is caused to emit light based on the following equation:

$$X_{now} = P_1 \times X_{min} \quad \text{(Equation 1)},$$

where the gate waveform generation parameter is represented by $P_1$.

Here, in order to make the on-duty ratio when a video image is displayed with the minimum number $V_{min}$ of vertical lines equal to the on-duty ratio when a video image is displayed with the total number $V_{now}$ of vertical lines in the current frame, the light extinction period $X_{now2}$ and the light emission period $X_{now3}$ when a video image is displayed with the total number $V_{now}$ of vertical lines in the current frame may be increased according to the ratio of the minimum number $V_{min}$ of vertical lines to the total number $V_{now}$ of vertical lines in the current frame.

Accordingly, the duty computation unit 54b calculates the gate waveform generation parameter $P_1$ as follows:

$$\begin{aligned} P_1 &= X_{now}/X_{min} \quad &\text{(Equation 2)}\\ &= X_{now2}/X_{min2} = X_{now3}/X_{min3} \\ &= V_{now}/V_{min}. \end{aligned}$$

Thus, the duty control unit 50 adjusts the light extinction period $X_{now2}$ when a video image is displayed with the total number $V_{now}$ of vertical lines in the current frame based on the following equation:

$$\begin{aligned} X_{now2} &= P_1 \times X_{min2} \quad &\text{(Equation 3)}\\ &= V_{now}/V_{min} \times X_{min2}. \end{aligned}$$

Likewise, the duty control unit 50 adjusts the light emission period $X_{now3}$ when a video image is displayed with the total number $V_{now}$ of vertical lines in the current frame based on the following equation:

$$\begin{aligned} X_{now3} &= P_1 \times X_{min3} \quad &\text{(Equation 4)}\\ &= V_{now}/V_{min} \times X_{min3}. \end{aligned}$$

With this configuration, the on-duty ratio when a video image is displayed with the minimum number $V_{min}$ of vertical lines and the on-duty ratio when a video image is displayed with the total number $V_{now}$ of vertical lines in the current frame can be made equal. Accordingly, when a video image is displayed with the total number $V_{now}$ of vertical lines in the current frame, the video image can be displayed at the same on-duty ratio as that when a video image is displayed with the minimum number $V_{min}$ of vertical lines. Accordingly, the occurrence of a flicker phenomenon can be suppressed.

To be specific, in the control device 20 according to the present embodiment, the video image period when a video image is displayed with the minimum number $V_{min}$ of vertical lines is set to a period of 100 pulses of the horizontal synchronization signal, and the video image period when a video image is displayed with the total number $V_{now}$ of vertical lines in the current frame is set to a period of 110 pulses of the horizontal synchronization signal, and thus the gate waveform generation parameter $P_1$ is calculated as $P_1 = 110/100 = 1.1$ by the light emission control unit 52. Accordingly, the light extinction or light emission period ($X_{now}$) of the light emitting elements 32 during one frame period when a video image is displayed with the total number $V_{now}$ of vertical lines in the current frame is adjusted by $X_{now} = 1.1 \times X_{min}$ by the duty control unit 50.

In the manner described above, the on-duty ratio when a video image is displayed with the minimum number $V_{min}$ of vertical lines and the on-duty ratio when a video image is displayed with the total number $V_{now}$ of vertical lines in the current frame can be made equal.

The initialization period $X_{now1}$ when a video image is displayed with the total number $V_{now}$ of vertical lines in the current frame may be the same as the initialization period $X_{min1}$ when a video image is displayed with the minimum number $V_{min}$ of vertical lines ($X_{now1} = X_{min1}$) as shown in (a) and (b) in FIG. 8. In this case as well, as described above, with the light extinction period $X_{now2}$ and the light emission period $X_{now3}$ obtained by multiplying the light extinction period $X_{min2}$ and the light emission period $X_{min3}$ by the gate waveform generation parameter $P_1$, the on-duty ratio when a video image is displayed with the minimum number $V_{min}$ of vertical lines and the on-duty ratio when a video image is displayed with the total number $V_{now}$ of vertical lines in the current frame can be made equal. Also, as with the light extinction period $X_{now2}$ and the light emission period $X_{now3}$ described above, the initialization period $X_{min1}$ may also be weighted by multiplying the initialization period $X_{min1}$ by the gate waveform generation parameter:

$$\begin{aligned} X_{now1} &= P_1 \times X_{min1} \quad &\text{(Equation 5)}\\ &= V_{now}/V_{min} \times X_{min1}. \end{aligned}$$

Also, in Equation 2, the gate waveform generation parameter $P_1$ can be expressed by the following equation:

$$\begin{aligned} P_1 &= V_{now}/V_{min} \quad &\text{(Equation 6)}\\ &= (V_{min} + V_{diff})/V_{min} \\ &= 1 + V_{diff}/V_{min}, \end{aligned}$$

where the difference between the minimum number $V_{min}$ of vertical lines and the total number $V_{now}$ of vertical lines in the current frame is represented by $V_{diff}$.

Accordingly, the duty control unit 50 can adjust the light extinction or light emission period ($X_{now}$) when a video image is displayed with the total number $V_{now}$ of vertical lines in the current frame based on the following equation:

$$X_{now} = (V_{min} + V_{diff})/V_{min} \times X_{min} \quad \text{(Equation 7)}$$
$$= (1 + V_{diff}/V_{min}) \times X_{min}$$
$$= X_{min} + V_{diff}/V_{min} \times X_{min}.$$

To be specific, in the control device 20 according to the present embodiment, the difference $V_{diff}$ between the video image period when a video image is displayed with the total number $V_{now}$ of vertical lines in the current frame and the video image period when a video image is displayed with the minimum number $V_{min}$ of vertical lines is a period of 10 pulses of the horizontal synchronization signal, and thus in the duty control unit 50, the light extinction or light emission period ($X_{now}$) during one frame period when a video image is displayed with the total number $V_{now}$ of vertical lines in the current frame is adjusted based on the following equation:

$$X_{now} = X_{min} + 10/100 \times X_{min} = X_{min} + 0.1 \times X_{min}.$$

As described above, in the control device 20 according to the present embodiment, even if the total number $V_{now}$ of vertical lines in the current frame is not supplied to the duty control unit 50 from the outside, if the difference $V_{diff}$ between the minimum number $V_{min}$ of vertical lines and the total number $V_{now}$ of vertical lines in the current frame is supplied, the control device 20 can adjust the light extinction or light emission period ($X_{now}$) when a video image is displayed with the total number $V_{now}$ of vertical lines in the current frame.

The initialization period $X_{now1}$ when a video image is displayed with the total number $V_{now}$ of vertical lines in the current frame may be the same as the initialization period $X_{min1}$ when a video image is displayed with the minimum number $V_{min}$ of vertical lines ($X_{now1}=X_{min1}$) as shown in (a) and (b) in FIG. 8. Also, as with the light extinction period $X_{now2}$ and the light emission period $X_{now3}$ described above, the initialization period $X_{min1}$ may also be weighted by multiplying the initialization period $X_{min1}$ by the gate waveform generation parameter $P_1$:

$$X_{now1} = P_1 \times X_{min1} \quad \text{(Equation 8)}$$
$$= (V_{min} + V_{diff})/V_{min} \times X_{min}$$
$$= (1 + V_{diff}/V_{min}) \times X_{min1}$$
$$= X_{min1} + V_{diff}/V_{min} \times X_{min1}.$$

Also, the video image period is set to a period of 100 pulses of the horizontal synchronization signal, the light extinction period (initialization period) is set to a period of 10 pulses of the horizontal synchronization signal, and the light emission period is set to a period of 90 pulses of the horizontal synchronization signal, but the periods are not necessarily set to the above-described values, and the video image period, the light extinction period, and the light emission period may be changed as appropriate.

6. Advantageous Effects, Etc.

As described above, with the control device 20 and the display device 1 according to the present embodiment, the light extinction period and the light emission period can be adjusted such that the on-duty ratio when a video image is displayed with the minimum number $V_{min}$ of vertical lines and the on-duty ratio when a video image is displayed with the total number $V_{now}$ of vertical lines in the current frame are equal. As a result, in the display device 1 controlled by the control device 20, even if the frame period varies due to the GPU's processing power or the like, it is possible to suppress a flicker phenomenon.

In the embodiment described above, as the control signal for controlling light emission and light extinction of the light emitting element 32, the light extinction signal EN that contains a light extinction instruction is used, but it is also possible to use a light emission signal that contains a light emission instruction according to the characteristics of the switch transistor 34.

Embodiment 2

Figure 9:
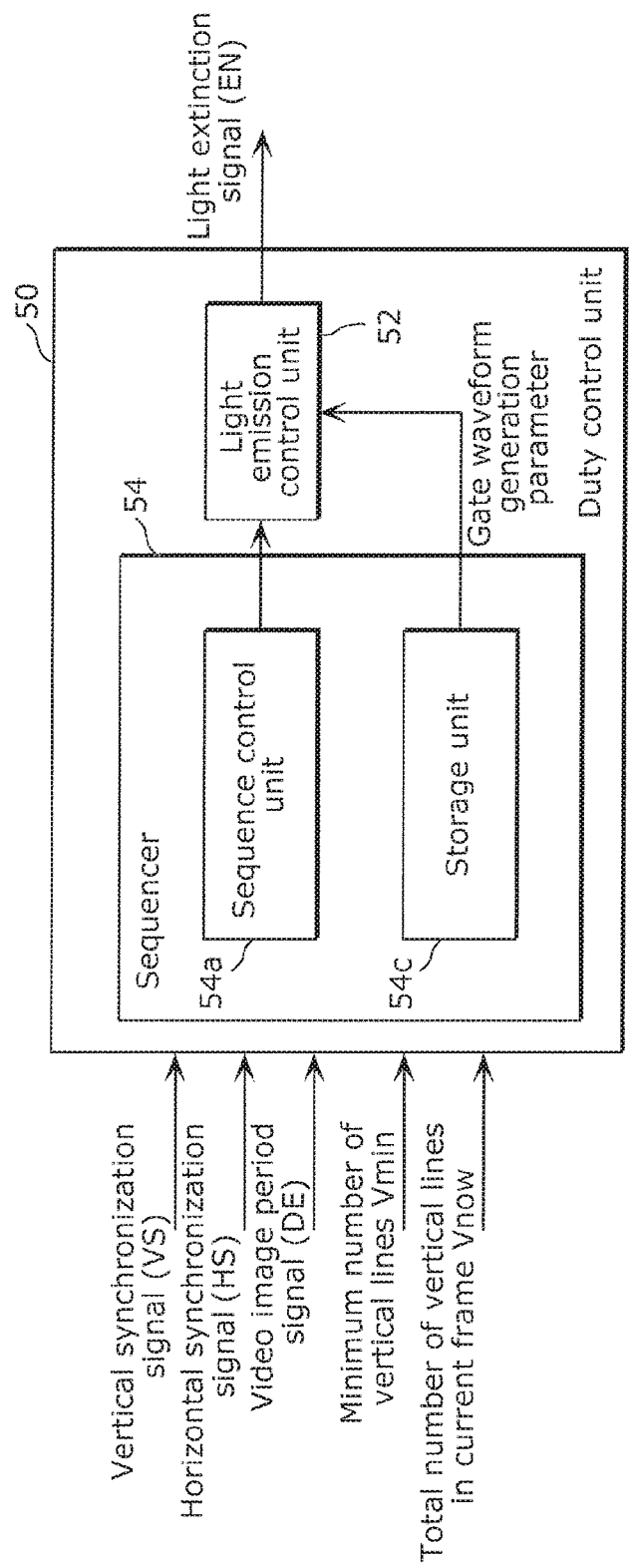
FIG. 9 is a block diagram showing a configuration of a display device according to Embodiment 2.

Next, Embodiment 2 will be described with reference to FIGS. 9 and 10. FIG. 9 is a block diagram showing a configuration of a display device according to the present embodiment. FIG. 10 is a diagram showing an example of a light emission luminance table stored in the display device according to the present embodiment.

The display device according to the present embodiment is different from the display device 1 according to Embodiment 1 in that a sequencer 54 included in the control device controls the light extinction and light emission period ($X_{now}$) based on a gate waveform generation table in which gate waveform generation parameters are stored in advance.

As shown in FIG. 9, in a duty control unit 50 included in a display device 1 according to the present embodiment, a sequencer 54 includes a sequence control unit 54a and a storage unit 54c. That is, the sequencer 54 is different from the sequencer 54 according to Embodiment 1 in that it includes the storage unit 54c in place of the duty computation unit 54b. The sequence control unit 54a has the same configuration as that of the sequence control unit 54a according to Embodiment 1, and thus a detailed description is omitted here.

The storage unit 54c is a memory in which control parameters and a control program for controlling the light extinction and light emission period of the light emitting element 32, and the like are stored. The storage unit 54c has a gate waveform generation table 70 that is referenced by the sequencer 54 when controlling the light extinction and light emission period ($X_{now}$) of the light emitting elements 32 when a video image is displayed with the total number $V_{now}$ of vertical lines in the current frame.

As shown in FIG. 10, in the gate waveform generation table 70, combinations of the minimum number $V_{min}$ of vertical lines, the total number $V_{now}$ of vertical lines in the current frame, and the difference $V_{diff}$ between the minimum number $V_{min}$ of vertical lines and the total number $V_{now}$ of vertical lines in the current frame are stored. In addition, gate waveform generation parameters calculated in advance for each combination are also stored together with the combinations.

The storage unit 54c selects a gate waveform generation parameter that corresponds to the minimum number $V_{min}$ of vertical lines and the total number $V_{now}$ of vertical lines in the current frame from the gate waveform generation table 70, and outputs the selected gate waveform generation parameter to the light emission control unit 52. The light emission control unit 52 adjusts the light extinction and light emission period ($X_{now}$) of the light emitting elements 32 when a video image is displayed with the total number $V_{now}$ of vertical lines in the current frame by using the gate waveform generation parameter supplied from the storage unit 54c.

With this configuration, the control device 20 can easily adjust the light extinction and light emission period ($X_{now}$) of the light emitting elements 32 when a video image is displayed with the total number $V_{now}$ of vertical lines in the current frame by selecting an optimal gate waveform generation parameter from the already calculated gate waveform generation parameters.

The storage unit 54c may select a gate waveform generation parameter that corresponds to the minimum number $V_{min}$ of vertical lines and the total number $V_{now}$ of vertical lines in the current frame from the gate waveform generation table 70, or may select a gate waveform generation parameter that corresponds to the difference $V_{diff}$ between the minimum number $V_{min}$ of vertical lines and the total number $V_{now}$ of vertical lines in the current frame from the gate waveform generation table 70. The storage unit 54c may select a gate waveform generation parameter that corresponds to the minimum number $V_{min}$ of vertical lines and the total number $V_{now}$ of vertical lines in the current frame when the total number $V_{now}$ of vertical lines in the current frame is notified from the outside, and select a gate waveform generation parameter that corresponds to the difference $V_{diff}$ between the minimum number $V_{min}$ of vertical lines and the total number $V_{now}$ of vertical lines in the current frame when the difference $V_{diff}$ between the minimum number $V_{min}$ of vertical lines and the total number $V_{now}$ of vertical lines in the current frame is notified.

Also, in the gate waveform generation table 70, it is unnecessary to store all of the four parameters as shown in FIG. 10: the minimum number $V_{min}$ of vertical lines, the total number $V_{now}$ of vertical lines in the current frame, the difference $V_{diff}$ between the minimum number $V_{min}$ of vertical lines and the total number $V_{now}$ of vertical lines in the current frame, and the gate waveform generation parameter. For example, it is possible to store only two parameters: the difference $V_{diff}$ between the minimum number of vertical lines and the total number $V_{now}$ of vertical lines in the current frame, and the gate waveform generation parameter.

Also, the storage unit 54c may have different gate waveform generation tables for each value of the minimum number $V_{min}$ of vertical lines, or may have different gate waveform generation tables for each value of the difference $V_{diff}$ between the minimum number of vertical lines and the total number $V_{now}$ of vertical lines in the current frame.

Also, the gate waveform generation parameter of the gate waveform generation table 70 may be changed as appropriate.

Also, the sequencer 54 may include, instead of the storage unit 54c, a duty computation unit 54b, or may include both a duty computation unit 54b and a storage unit 54c. In this case, the sequencer 54 may store new gate waveform generation parameters with respect to the minimum number $V_{min}$ of vertical lines and the total number $V_{now}$ of vertical lines in the current frame calculated in the previous adjustment of the light extinction and light emission period ($X_{now}$) of the light emitting elements 32 into the gate waveform generation table 70, and select a gate waveform generation parameter from the gate waveform generation table 70 when adjustment of the light extinction and light emission period ($X_{now}$) of the light emitting elements 32 is performed next time.

Embodiment 3

Next, Embodiment 3 will be described with reference to FIGS. 11 to 16.

A control device according to the present embodiment is different from the control device according to Embodiment 1 in that a video image is displayed by dividing the light extinction period adjusted according to the total number of vertical lines during one frame period.

Figure 11:
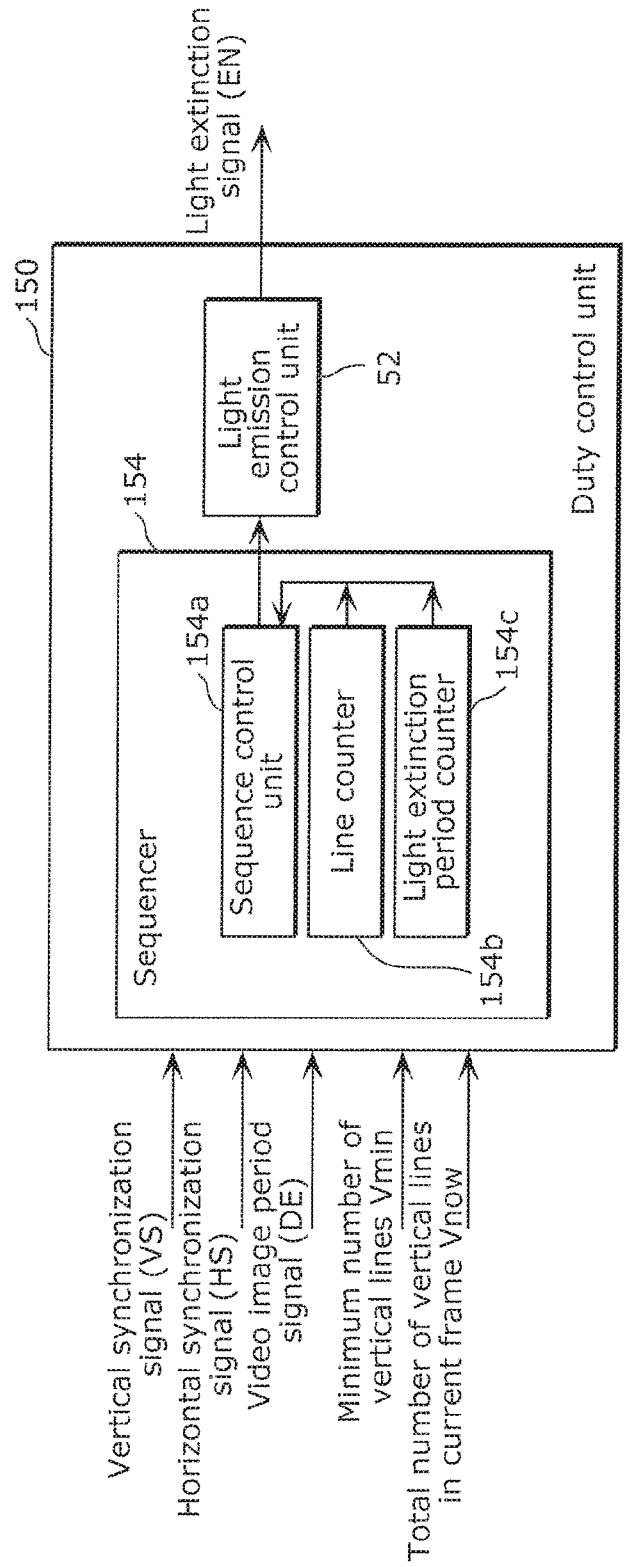
FIG. 11 is a block diagram showing a configuration of a duty control unit according to Embodiment 3.

FIG. 11 is a block diagram showing a configuration of a duty control unit 150 according to the present embodiment. As shown in FIG. 11, the duty control unit 150 according to the present embodiment includes a sequencer 154, and a light emission control unit 52. The sequencer 154 includes a sequence control unit 154a, a line counter 154b, and a light extinction period counter 154c. The light emission control unit 52 and the sequence control unit 154a have the same configurations as those of the light emission control unit 52 and the sequence control unit 54a according to Embodiment 1, and thus a detailed description thereof is omitted here.

The line counter 154b is a counter that counts the number of vertical lines actually displayed on a video image from the start of one frame period.

The light extinction period counter 154c is a counter for counting a period during which the light emitting elements 32 actually extinguish light. The light extinction period counter 154c is, for example, a timer, and starts counting by a count trigger supplied from the synchronization control unit 28.

Figure 12:
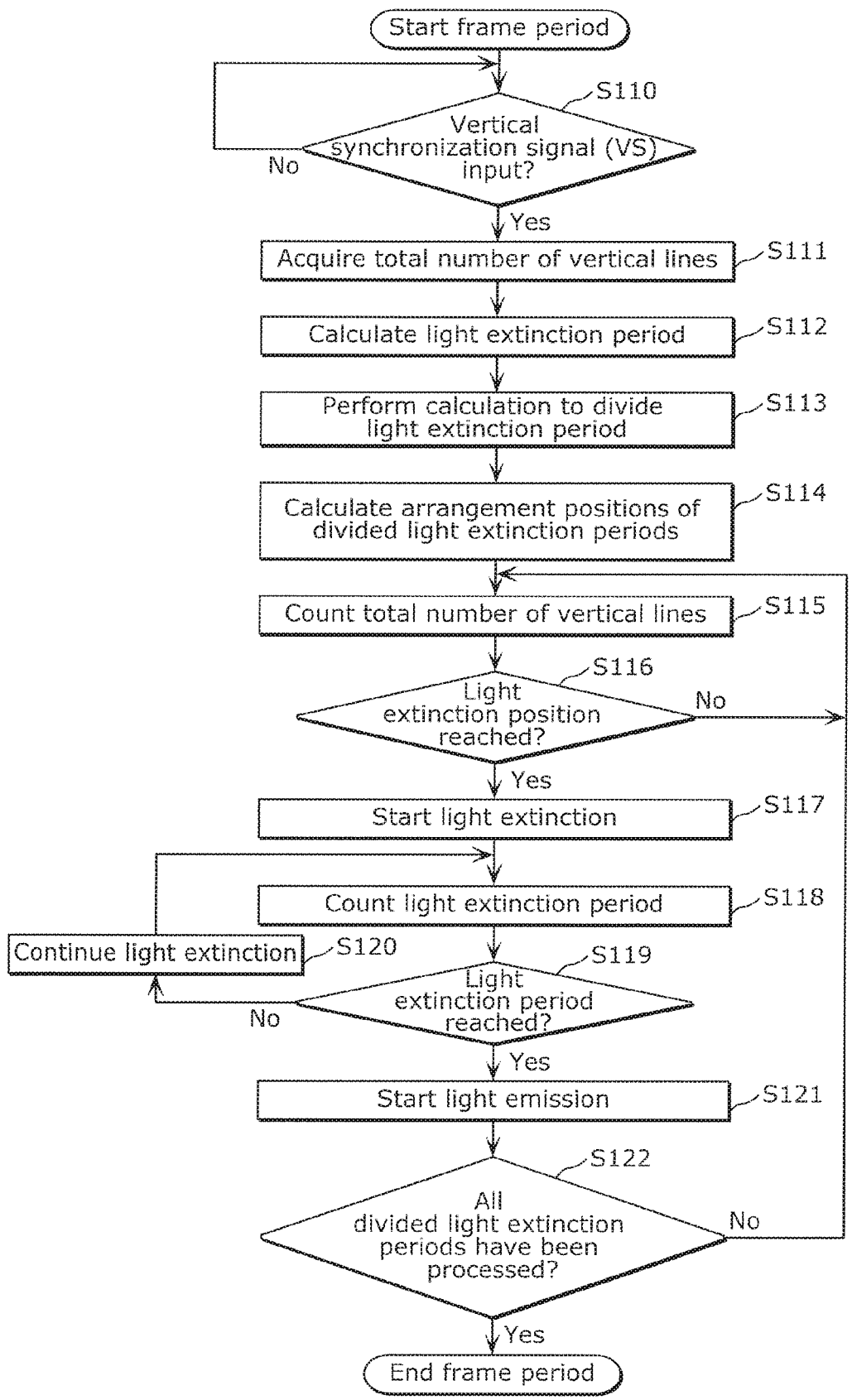
FIG. 12 is a flowchart illustrating operations performed during one frame period in a control device according to Embodiment 3.

FIG. 12 is a flowchart illustrating operations performed during one frame period in the control device 20 according to the present embodiment. A detailed description of configurations and operations of the control device that are the same as those of the control device 20 according to Embodiments 1 and 2 will be omitted.

As shown in FIG. 12, first, in the control device 20, it is detected whether or not a vertical synchronization signal VS has been input from the outside (step S110). If a vertical synchronization signal VS is input from the synchronization control unit 28 into the duty control unit 50 (Yes in step S110), a video image period is started. If a vertical synchronization signal VS is not supplied from the synchronization control unit 28 into the duty control unit 50 (No in step S110), a video image period is not started, and it is again detected whether or not a vertical synchronization signal VS has been input into the control device 20 from the outside.

Subsequently, the duty control unit 50 is notified from the outside of the total number of vertical lines included in each frame period (step S111). The notified total number of vertical lines includes a minimum number $V_{min}$ of vertical lines required to render one frame and a total number $V_{now}$ of vertical lines in the current frame.

Next, in the sequence control unit 154a, a light extinction period in the current frame is calculated (step S112). The sequence control unit 154a calculates the length of the light extinction period in the current frame based on the minimum number $V_{min}$ of vertical lines and the total number $V_{now}$ of vertical lines in the current frame that were notified, and the on-duty ratio.

Then, the sequence control unit 154a performs calculation so as to divide the calculated light extinction period in the current frame into a plurality of periods (dividing step) (step S113). Furthermore, the sequence control unit 154a calculates arrangement positions to determine the positions (time) of the plurality of divided light extinction periods (light extinction period arrangement step) (step S114). As used herein, the arrangement positions refer to temporal arrangement positions. The arrangement position and the length of the light extinction period are set based on the number of vertical lines. That is, the number of vertical lines is counted from the start of one frame period, and a light extinction period is started at the time when the number of vertical lines set as a light extinction position is counted. Also, the light emission period is ended at the time when a predetermined number of vertical lines is counted from the start of the light extinction period, and a light emission period is started.

The sequence control unit 154a generates a sequence set using the number of vertical lines as described above based on the arrangement positions and the lengths of the plurality of divided light extinction periods. Furthermore, the sequencer 154 outputs the generated sequence to the light emission control unit 52 (light extinction period adjusting step).

The light emission control unit 52 generates a light extinction signal EN based on the sequence generated by the sequence control unit 54a. The light extinction signal EN is a signal for starting a light extinction period.

Here, as described above, when the duty control unit 50 receives a vertical synchronization signal VS, and one frame period is started, the line counter 154b of the sequencer 154 counts the number of vertical lines from the start of one frame period (step S115). Then, when the counted number of vertical lines reaches a light extinction position set by the sequencer 154 (Yes in step S116), a light extinction signal EN is supplied from the duty control unit 50 to each pixel circuit 30 via the gate driving circuit 14. In response thereto, the switch transistor 34 of the pixel circuit 30 is turned off, and thus the light emitting element 32 enters a light extinguishing state, and a light extinction period starts (step S117).

Also, if the number of vertical lines obtained by counting does not reach the light extinction position set by the sequencer 154 (No in step S116), the light extinction signal EN is not supplied to the pixel circuit 30, and the line counter 154b again counts the number of vertical lines (step S115).

During the light extinction period, the pixel circuit 30 is initialized. Also, if a video image period signal DE is input into the synchronization control unit 28, the video image signal is temporarily written into the data storing unit 26, and read out. The input of the video image period signal DE may be performed during the light extinction period, or may be performed continuously after the end of the initialization period. Also, the timing at which the writing of the video image signal into the data storing unit 26 is started is not limited to when the video image period signal DE is input into the synchronization control unit 28, and may be when the duty control unit 50 receives the vertical synchronization signal VS.

Also, when the light extinction period starts, the actual light extinction period is counted by the light extinction period counter 154c (step S118). If the counted light extinction period does not reach the set light extinction period (No in step S119), the light extinction period is continued (step S120).

Also, if the counted light extinction period reaches the set light extinction period (Yes in S119), the light extinction period is ended, and a light emission period is started (step S121). That is, the supply of the light extinction signal EN to the pixel circuit 30 is stopped, and thus the switch transistor 34 of the pixel circuit 30 is turned on. In response thereto, the light emitting element 32 emits light.

The light emitting element 32 emits light according to the video image signal readout from the data storing unit 26. The video image signal readout from the data storing unit 26 is supplied to the source driving circuit 16. The source driving circuit 16 causes the light emitting element 32 of each pixel circuit 30 in the panel unit 12 to emit light based on the supplied video image signal. The video image signal is thereby displayed on the panel unit 12.

Furthermore, the foregoing steps are repeated until all of the divided light extinction periods have been processed (video image display step) (No in step S122). If all of the divided light extinction periods have been processed, (Yes in step S122), one frame period ends.

Figure 13:
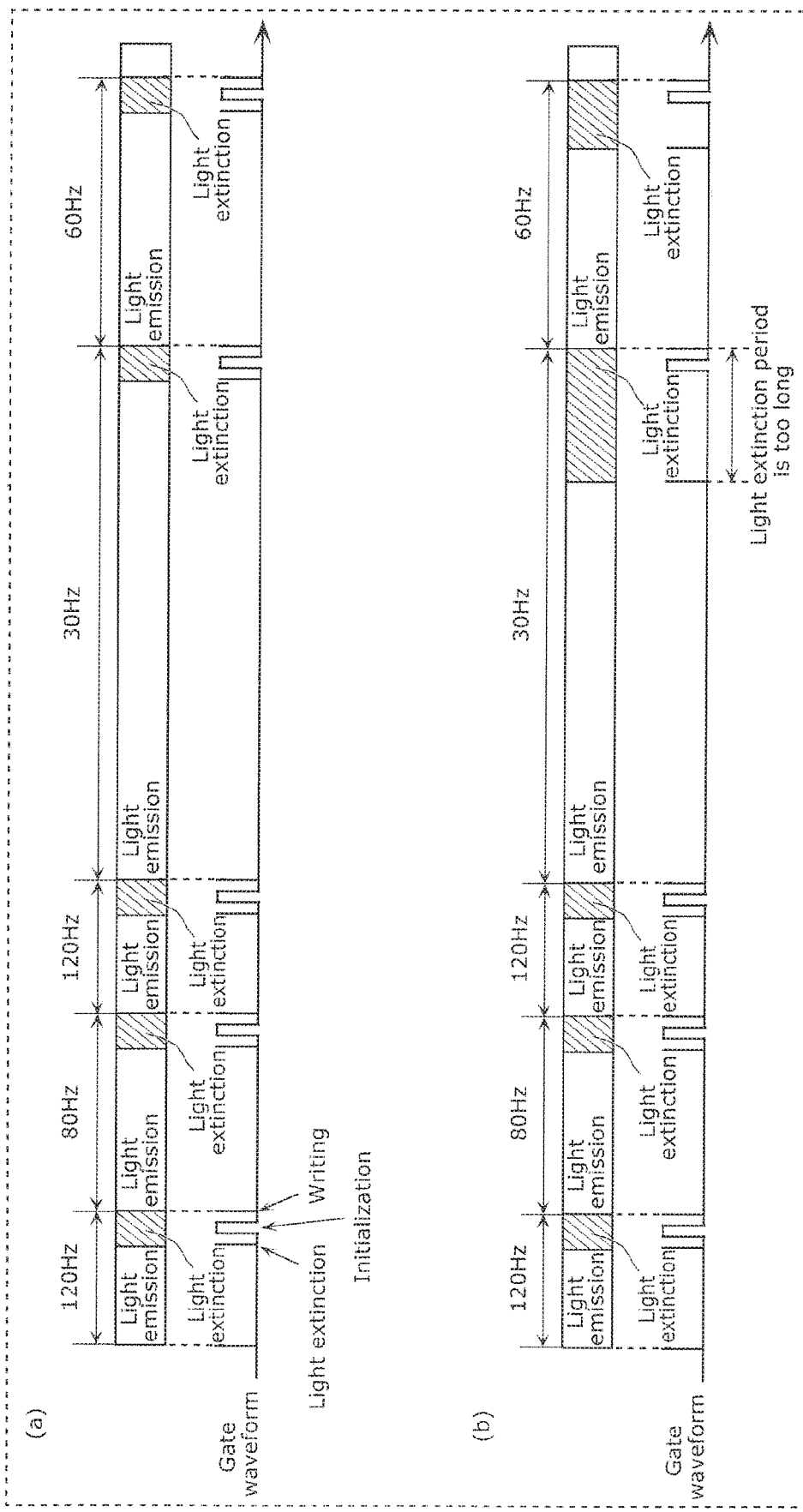
FIG. 13 is a diagram illustrating a feature of the operations performed in the control device according to Embodiment 3, with (a) showing an example when a video image is displayed by a control device according to Comparative Example 1, and (b) showing an example when a video image is displayed by a control device according to Comparative Example 2.

Here, a feature of the operations performed in the control device 20 according to the present embodiment will now be described. FIG. 13 is a diagram illustrating a feature of the operations performed in the control device 20 according to the present embodiment. (a) in FIG. 13 shows an example when a video image is displayed by a control device according to Comparative Example 1, showing the state of display of a video image (light emission or light extinction) in the case where the length of the light extinction period is kept constant even when the frame rate, or in other words, the number of vertical lines in one frame period is changed. (b) in FIG. 13 shows an example when a video image is displayed by a control device according to Comparative Example 2, showing the state of display of a video image in the case where the length of the light extinction period is changed when the frame rate is changed.

In general, the light extinction period that is included in one frame period is arranged in an integrated manner at one location such as, for example, at the beginning or the end of the frame. In this case, as shown in Comparative Example 1 that is shown in (a) in FIG. 13, in the case where the length of the light: extinction period is kept constant even if the frame rate is changed, the light emission period becomes long when the frame rate is slow, and thus a flicker phenomenon occurs in which flickering appears on the screen.

Also, as shown in Comparative Example 2 that is shown in (b) in FIG. 13, in the case where the length of the light extinction period is changed if the frame rate is changed, by increasing the light extinction period according to the length of one frame period, the on-duty ratio in each frame can be made constant. However, as shown in (b) in FIG. 13, for example, if the frame rate is decreased as low as 30 Hz, the light extinction period becomes long, and thus a flicker phenomenon occurs in which flickering appears on the screen.

In contrast, in the control device 20 according to the present embodiment, the light extinction period in one frame period is divided into a plurality of periods, and the resulting divided light extinction periods are arranged not only at the beginning or end of one frame period, but also arranged in a distributed manner at a plurality of arrangement positions in one frame period. Here, by setting the position of a light extinction period in one frame period to the same position as the position of the light extinction period in one frame period when a video image is displayed with the minimum number of vertical lines, it is possible to display a video image with the total number $V_{now}$ of vertical lines in the current frame artificially as if it is displayed at the same frame rate as that when a video image is displayed with the minimum number $V_{min}$ of vertical lines. As a result, flickering does not appear on the screen even if the frame rate is changed, and thus the occurrence of the flicker phenomenon can be suppressed.

Figure 14:
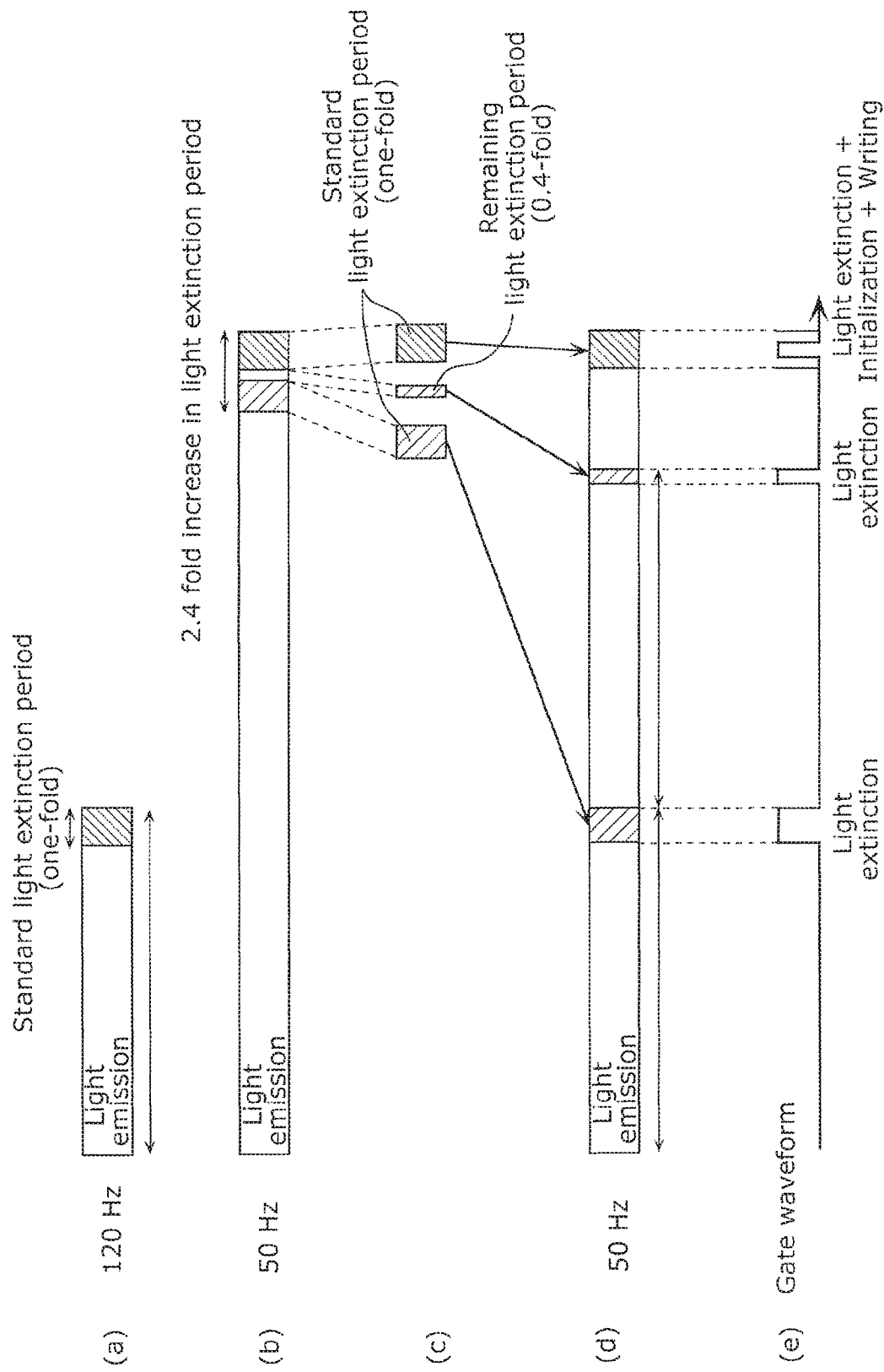
FIG. 14 is a diagram illustrating the division of a light extinction period performed in the control device according to Embodiment 3, with (a) showing an example when a video image is displayed with the minimum number of vertical lines, (b) showing the calculation of a light extinction period, (c) showing the calculation performed so as to divide the light extinction period, (d) showing the calculation of the arrangement positions of the light extinction periods, and (e) showing a waveform of a gate signal.

Hereinafter, the division of the light extinction period will be described in detail. FIG. 14 is a diagram showing the division of the light extinction period performed in the control device 20 according to the present embodiment, with (a) showing an example when a video image is displayed with a minimum number of vertical lines, and (b) showing the calculation of the light extinction period, (c) showing the calculation performed so as to divide the light extinction period, (d) showing the calculation of the arrangement positions of the light extinction periods, and (e) showing a waveform of a gate signal.

In FIG. 14, (a) shows a light emission period and a light extinction period in the case where a video image is displayed at a frame rate of 120 Hz (the minimum number of vertical lines). If the light extinction period at this time is taken as the standard light extinction period, in the case where a video image is displayed at a frame rate of 50 Hz, the light extinction period is calculated so as to increase the light extinction period according to the frame rate (step S112 in FIG. 12). Then, the light extinction period is calculated to be 2.4 fold (=120/50) the standard light extinction period as shown in (b) in FIG. 14. Accordingly, the length of the light extinction period becomes significantly longer than the standard light extinction period, and thus a flicker phenomenon occurs.

Accordingly, as shown in (c) in FIG. 14, calculation is performed so as to divide the light extinction period into a plurality of periods (step S113 in FIG. 12). For example, calculation is performed such that the light extinction period that is 2.4 fold longer than the standard light extinction period is divided into three periods; two periods that have the same length as the standard light extinction period; and the remaining period (0.4 fold the standard light extinction period).

Also, as shown in (d) in FIG. 14, the three divided periods are arranged at a plurality of positions in one frame period. For example, as shown in (d) in FIG. 14, arrangement positions are calculated such that one of the periods that have the same length as the standard light extinction period is provided at the same position as the light extinction period in the case where the frame rate is 120 Hz (step S114 in FIG. 12). Also, the other light extinction period that has the same length as the standard light extinction period is provided at the end of the frame period. Also, the light extinction period that is 0.4 fold of the standard light extinction period is provided a position that is after the end of the initial light extinction period and corresponds to the same positon as the light extinction period in the case where the frame rate is 120 Hz. Because the pixel circuit 30 is initialized during the light extinction period that is provided at the end of the frame period, it is necessary to secure a light extinction period having a certain length, and thus the light extinction period that has the same length as the standard light extinction period is provided. By including the initialization period in the light extinction period that is provided at the end of the frame period, it is possible to appropriately display a video image in the subsequent frame period. The position of the light extinction period during which the pixel circuit 30 is initialized is not limited to the end of the frame period, and may be any other position. In this case, in the frame period, the light extinction period that has the same length as the standard light extinction period may be provided at the position where initialization is performed.

Furthermore, as shown in (e) in FIG. 14, a gate waveform is generated by the duty control unit 50 according to the divided light extinction periods that are arranged.

With this configuration, it is possible to display a video image at a frame rate of 50 Hz artificially as if it is displayed at a frame rate of 120 Hz.

Figure 15:
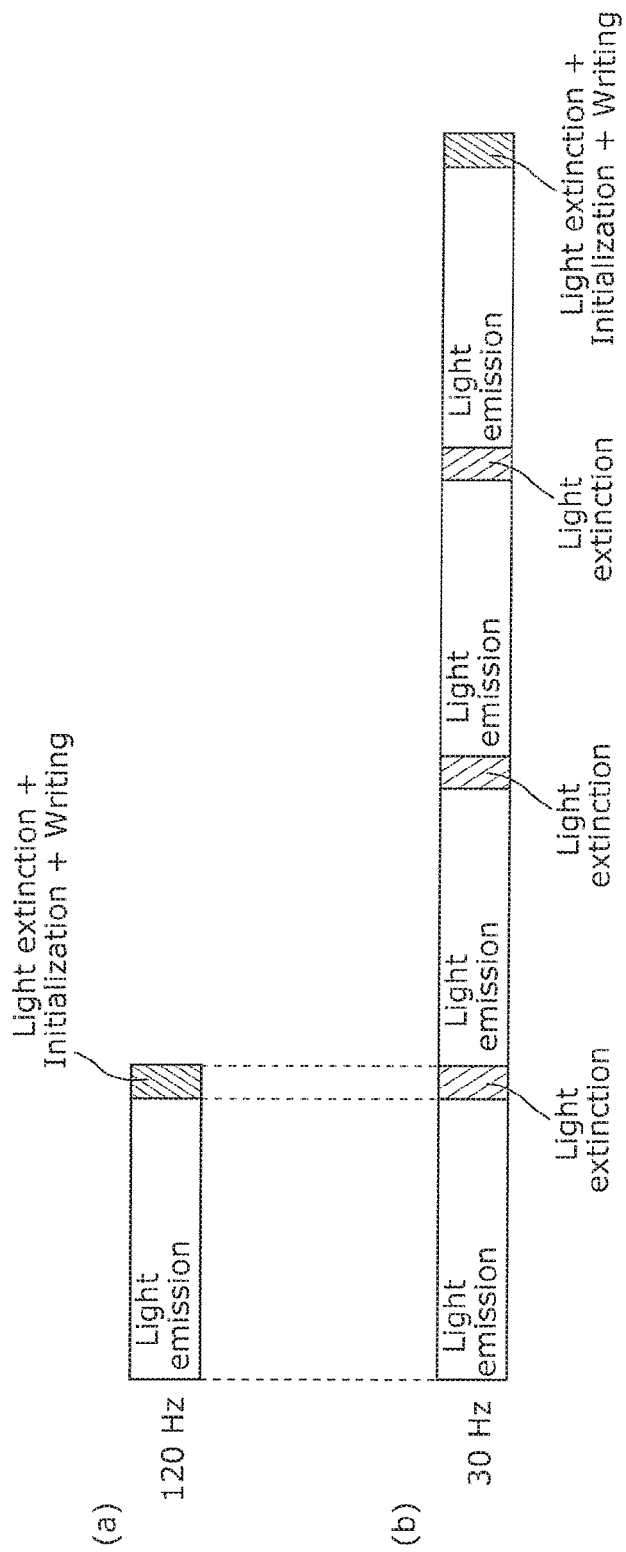
FIG. 15 is a diagram illustrating a feature of the operations performed in the control device according to Embodiment 3, with (a) showing an example when a video image is displayed at a frame rate (120 Hz) according to a comparative example, and (b) showing an example when a video image is displayed at a frame rate (30 Hz) according to the present embodiment.

Also, FIG. 15 is a diagram illustrating a feature of the operations performed in the control device 20 according to the present embodiment, with (a) showing an example when a video image is displayed with the minimum number of vertical lines (at a frame rate of 120 Hz), and (b) showing an example when a video image is displayed with the total number of vertical lines in the current frame (at a frame rate of 30 Hz). As shown in (a) and (b) in FIG. 15, when a video image is displayed at a frame rate of 30 Hz, the video image can be displayed as if a video image at a frame rate of 120 Hz is displayed four times.

As described above, if the minimum number of vertical lines is a multiple of the total number of vertical lines in the current frame, the light extinction period can be divided into equal parts based on the standard light extinction period, and thus a video image with the total number of vertical lines in the current frame can be displayed as if a video image with the minimum number of vertical lines is displayed, without causing a sense of discomfort.

Figure 16:
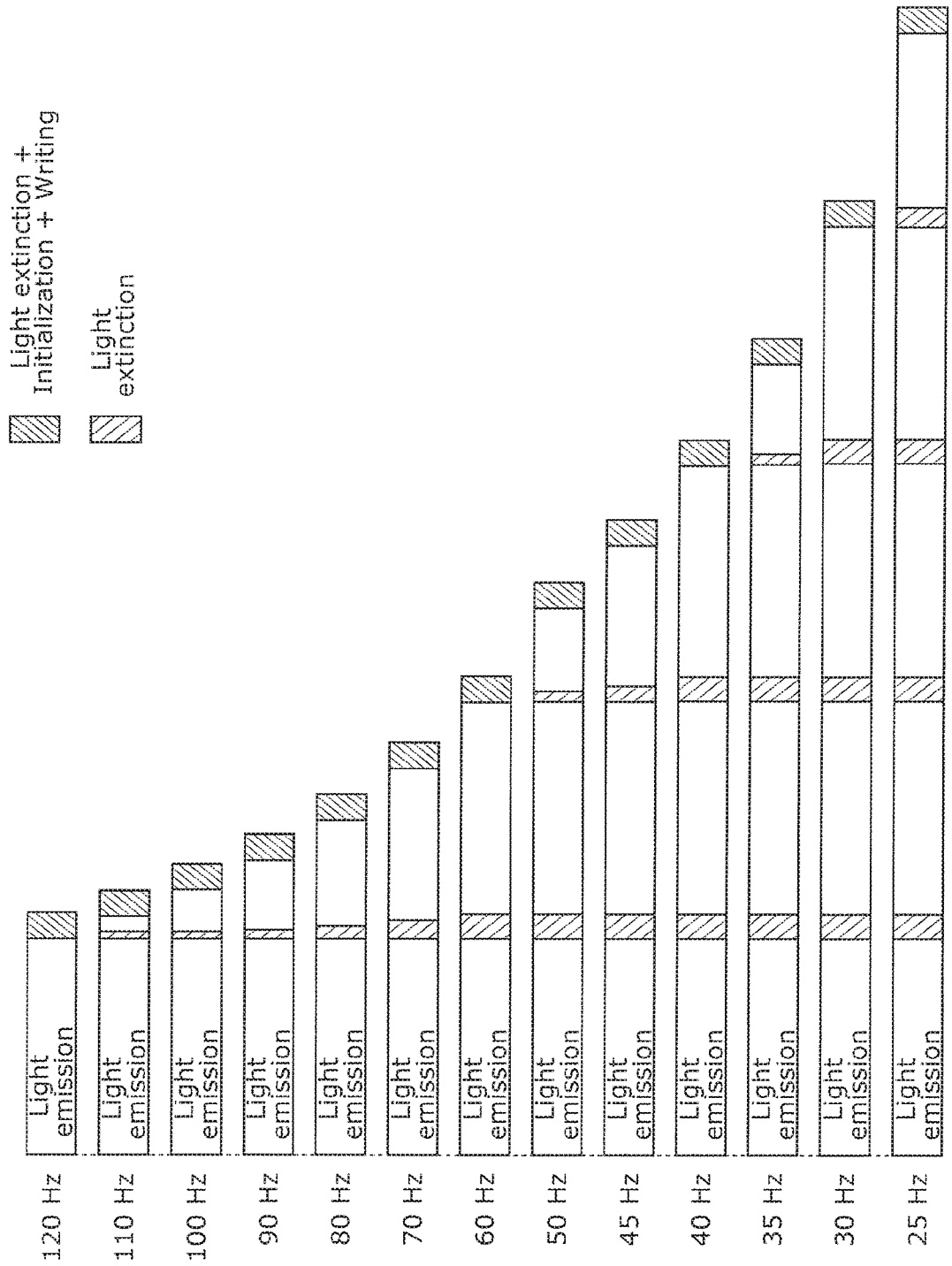
FIG. 16 is a diagram illustrating video image display when the frame rate is changed in the control device according to Embodiment 3.

FIG. 16 is a diagram illustrating video image display when the frame rate is changed in the control device according to the present embodiment. As shown in FIG. 16, the division of the light extinction period is performed not only when the frame rate is set to 30 Hz and 50 Hz as described above, but also when the frame rate is set to any other value. Also, the division of the light extinction period is performed not only when the minimum number of vertical lines is a multiple of the total number of vertical lines in the current frame, but also when the minimum number of vertical lines is not a multiple of the total number of vertical lines in the current frame. By dividing the light extinction period in a frame period into a plurality of periods and arranging the divided periods, and thereby, for example, making the light extinction period shorter than the standard light extinction period, it is possible to suppress a flicker phenomenon.

Variation 1

Figure 17:
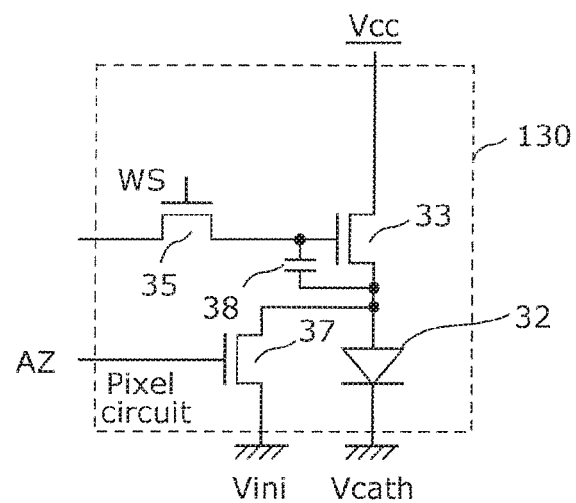
FIG. 17 is a circuit diagram showing a configuration of a pixel circuit according to Variation 1 of Embodiments 1 to 3.

FIG. 17 is a circuit diagram showing a configuration of a pixel circuit 130 according to Variation 1 of Embodiment 1. The pixel circuit 130 according to the present variation is different from the pixel circuit 30 according to the embodiment in that the pixel circuit 130 according to the present variation does not include switch transistors 34 and 36.

As shown in FIG. 17, the pixel circuit 130 includes a light emitting element 32, a driving transistor 33, a selection transistor 35, a switch transistor 37, and a pixel capacitor 38. The configurations of the light emitting element 32, the driving transistor 33, the selection transistor 35, the switch transistor 37, and the pixel capacitor 38 are the same as the configurations of the light emitting element 32, the driving transistor 33, the selection transistor 35, the switch transistor 37, and the pixel capacitor 38 of the pixel circuit 30 according to Embodiment 1.

Here, the pixel circuit 130 does not include a switch transistor 34, and thus the light emission of the light emitting element 32 is performed by the switch transistor 37, rather than the light emission of the light emitting elements 32 being performed collectively by the light extinction signal EN.

At this time, when a control signal AZ is applied from the gate driving circuit 14 to the gate of the switch transistor 37, and the switch transistor 37 is turned on, the drain-to-source current of the driving transistor 33 flows through the switch transistor 37, but does not flow through the light emitting element 32. Accordingly, the light emitting element 32 extinguishes light. On the other hand, when the application of the control signal AZ to the gate of the switch transistor 37 is stopped, and the switch transistor 37 is turned off, the drain-to-source current of the driving transistor 33 flows through the light emitting element 32. Accordingly, the light emitting element 32 emits light.

Also, because the pixel circuit 130 does not include a switch transistor 36, the initialization operation is performed by the selection transistor 35 and the switch transistor 37.

Even with a display panel that includes the pixel circuit 130 configured described above, it is possible to suppress a flicker phenomenon as with the display device 1 according to Embodiment 1.

Variation 2

Figure 18:
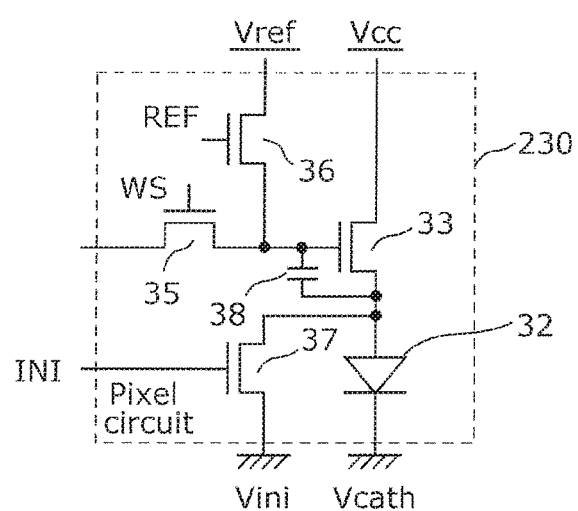
FIG. 18 is a circuit diagram showing a configuration of a pixel circuit according to Variation 2 of Embodiments 1 to 3.
Figure 19:
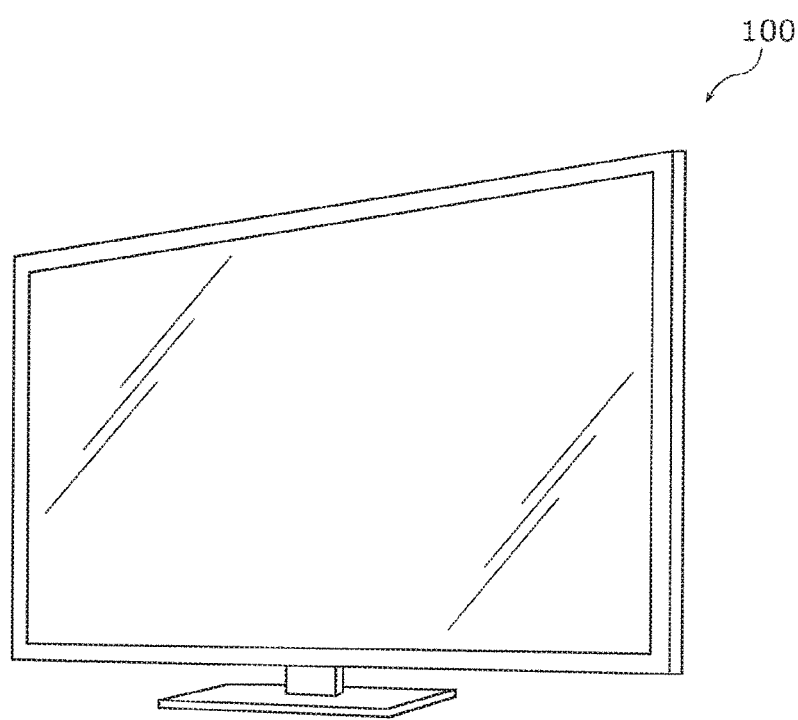
FIG. 19 is an external view of a thin flat television system that is an example of a display device in which the control device according to any one of Embodiments 1 to 3 is incorporated.

FIG. 18 is a circuit diagram showing a configuration of a pixel circuit 230 according to Variation 2 of Embodiment 1. The pixel circuit 230 according to the present variation is different from the pixel circuit 30 according to Embodiment 1 in that the pixel circuit 230 according to the present variation does not include a switch transistor 34.

As shown in FIG. 18, the pixel circuit 230 includes a light emitting element 32, a driving transistor 33, a selection transistor 35, switch transistors 36 and 37, and a pixel capacitor 38. The configurations of the light emitting element 32, the driving transistor 33, the selection transistor 35, the switch transistors 36 and 37, and the pixel capacitor 38 are the same as the configurations of the light emitting element 32, the driving transistor 33, the selection transistor 35, the switch transistors 36 and 37, and the pixel capacitor 38 of the pixel circuit 30 according to Embodiment 1.

Here, the pixel circuit 230 does not include a switch transistor 34, and thus the light emission of the light emitting element 32 is performed by the switch transistor 37, rather than the light emission of the light emitting elements 32 being performed collectively by the light extinction signal EN.

At this time, when a control signal INI is applied from the gate driving circuit 14 to the gate of the switch transistor 37, and the switch transistor 37 is turned on, the drain-to-source current of the driving transistor 33 flows through the switch transistor 37, but does not flow through the light emitting element 32. Accordingly, the light emitting element 32 extinguishes light. On the other hand, when the application of the control signal INI to the gate of the switch transistor 37 is stopped, and the switch transistor 37 is turned off, the drain-to-source current of the driving transistor 33 flows through the light emitting element 32. Accordingly, the light emitting element 32 emits light.

Even with a display panel that includes the pixel circuit 230 configured described above, it is possible to suppress a flicker phenomenon as with the display device 1 according to the embodiment.

Other Embodiments

The present disclosure is not limited to the configurations described in the embodiments and the variations given above, and it is possible to make modifications as appropriate.

For example, the gate waveform generation parameter may be set as the ratio of one frame period when a video image is displayed with the minimum number $V_{min}$ of vertical lines to one frame period when a video image is displayed with the total number $V_{now}$ of vertical lines in the current frame, or may be set as the ratio of the light emission period when a video image is displayed with the minimum number $V_{min}$ of vertical lines to the light emission period when a video image is displayed with the total number $V_{now}$ of vertical lines in the current frame.

Also, the light extinction period may be adjusted by using the minimum number $V_{min}$ of vertical lines and the total number $V_{now}$ of vertical lines in the current frame, or may be adjusted by using the difference $V_{diff}$ between the minimum number $V_{min}$ of vertical lines and the total number $V_{now}$ of vertical lines in the current frame.

Also, the gate waveform generation parameter may be obtained by calculation, or may be selected from a gate waveform generation table in which calculated parameters are stored in advance.

Also, the configuration of the sequencer is not limited to the configuration described above. For example, besides the counter that counts the light extinction period, the sequencer may include a counter that counts the video image period, a counter that counts the light emission period, and the like. Alternatively, these counters may be implemented by one counter. Also, the sequencer may include all of the duty computation unit, the storage unit, the line counter, and the light extinction according to the embodiment described above, or may include a part of them.

Also, the division of the light extinction period may be performed not only when the minimum number of vertical lines is a multiple of the total number of vertical lines in the current frame, but also when the minimum number of vertical lines is not a multiple of the total number of vertical lines in the current frame.

Also, the arrangement position of a divided light extinction period is not necessarily the position of the light extinction period when a video image is displayed with the minimum number of vertical lines as described above, and may be any other position.

Also, the gate driving circuit may be provided on one of the short sides of the panel unit, or may be provided on each of the opposing short sides of the panel unit. Likewise, the source driving circuit may be provided on one of the long sides of the panel unit, or may be provided on each of the opposing long sides of the panel unit.

Also, in the control device 20, the frame period may be started based on the supply of a vertical synchronization signal VS, or may be based on the input start timing of a video image period signal DE, or in other words, the timing at which the input of a video image period signal DE that is input after the vertical synchronization signal VS is started.

Also, in the initialization period, the EN signal for causing the light emitting elements 32 to extinguish light is not necessarily supplied to the switch transistor 34. That is, in the initialization period, the switch transistor 34 is not necessarily turned on (non-conducting state) and off (conducting state) repeatedly, and may be constantly in an off-state. Also, the switch transistor 34 may be turned on or off only when Duty is generated.

Also, as described above, the data storing unit may be composed of line buffers, may be composed of other buffers, or may be a storage device, or the like.

Also, the light emitting elements are not limited to organic EL elements, and may be any other light emitting elements such as LEDs. The on-duty ratio of the light emitting elements is not limited to 90%, and may be changed as appropriate.

Also, as the control signal for controlling light emission and light extinction of the light emitting elements, a light extinction signal EN that contains a light extinction instruction may be used, or a light emission signal that contains a light emission instruction may be used according to the characteristics of the transistors.

Also, in the display device, the pixel circuit configuration is not limited to those shown in the embodiments and the variations given above, and may be changed. For example, as long as each pixel circuit is configured to include a driving transistor, a selection transistor, and a pixel capacitor, the arrangement of other switch transistors may be changed as appropriate. Also, a plurality of transistors provided in the pixel circuit may be polysilicon TFTs, or other transistors such as amorphous silicon TFTs. Also, the conductivity type of the transistors may be N channel type or P channel type, or may be a combination thereof.

The present disclosure also encompasses other embodiments obtained by making various modifications that can be conceived by a person having ordinary skill in the art to the above-described embodiments as well as embodiments implemented by any combination of the structural elements and the functions of the above embodiment without departing from the scope of the present disclosure. For example, as examples of the display device that includes the control device according to the present disclosure, a thin flat television system 100 as shown in FIG. 12, a gaming console in which a display panel is incorporated, and a PC monitor system are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful in technical fields such as, in particular, television systems, and displays for gaming consoles and personal computers that are required to provide a display at a high resolution and at a high speed.

What is claimed is:

1. A method for driving a display panel, including a plurality of pixel circuits that are arranged in rows and columns, that displays a video image signal that includes a plurality of images having different frame periods, the method comprising:
setting a frame period, the frame period including one or more light emission periods during which the display panel emits light, and one or more light extinction periods during which the display panel extinguishes light;
dividing at least one frame period into a plurality of light emission periods and a plurality of light extinction periods;
adjusting lengths of the plurality of light emission periods and lengths of the plurality of light extinction periods based on a ratio between a maximum frequency of the frame period and a currently set frequency of the frame period; and
displaying the video image signal by causing light emitting elements of the display panel to emit light during the adjusted lengths of the plurality of light emission periods, and to extinguish light during the adjusted lengths of the plurality of light extinction periods,
wherein only one light extinction period is provided in a frame period set at the maximum frequency.

2. The method for driving a display panel according to claim 1,
wherein the currently set frequency of the frame period, including the plurality of divided light extinction periods, is set at a frequency lower than the maximum frequency of the frame period.

3. The method for driving a display panel according to claim 1,
wherein an initialization period and a writing period follow a last light extinction period in a frame period.

4. A method for driving a display panel, including a plurality of pixel circuits that are arranged in rows and columns, that displays a video image signal that includes a plurality of images having different frame periods, the method comprising:
setting a frame period, the frame period including one or more light emission periods during which the display panel emits light, and one or more light extinction periods during which the display panel extinguishes light;
dividing at least one frame period into a plurality of light emission periods and a plurality of light extinction periods;
adjusting lengths of the plurality of light emission periods and lengths of the plurality of light extinction periods based on a ratio between a maximum frequency of the frame period and a currently set frequency of the frame period; and
displaying the video image signal by causing light emitting elements of the display panel to emit light during the adjusted lengths of the plurality of light emission periods, and to extinguish light during the adjusted lengths of the plurality of light extinction periods,
wherein a total amount of time of the plurality of the divided light extinction periods in a frame is set by a ratio between the maximum frequency of the frame period and a lower frequency of the current frame period, and
wherein the divided light extinction periods each have a same time duration when the ratio of the maximum frequency of the frame period divided by the lower frequency of the current frame period is a whole number.

5. A method for driving a display panel, including a plurality of pixel circuits that are arranged in rows and columns, that displays a video image signal that includes a plurality of images having different frame periods, the method comprising:
setting a frame period, the frame period including one or more light emission periods during which the display panel emits light, and one or more light extinction periods during which the display panel extinguishes light;
dividing at least one frame period into a plurality of light emission periods and a plurality of light extinction periods;
adjusting lengths of the plurality of light emission periods and lengths of the plurality of light extinction periods based on a ratio between a maximum frequency of the frame period and a currently set frequency of the frame period; and
displaying the video image signal by causing light emitting elements of the display panel to emit light during the adjusted lengths of the plurality of light emission periods, and to extinguish light during the adjusted lengths of the plurality of light extinction periods,
wherein a total amount of time of the plurality of the divided light extinction periods in a frame is set by a ratio between the maximum frequency of the frame period and a lower frequency of the current frame period, and
wherein all but one of the divided light extinction periods has a same time duration when the ratio of the maximum frequency of the frame period divided by the lower frequency of the current frame period is not a whole number.

6. The method for driving a display panel according to claim 5,
wherein the one divided light extinction period not having the same time duration has a lesser time duration.

7. The method for driving a display panel according to claim 6,
wherein the one divided light extinction period having the lesser time duration is not located as a last light extinction period in a frame period.

8. A method for driving a display panel, including a plurality of pixel circuits that are arranged in rows and columns, that displays a video image signal that includes a plurality of images having different frame periods, the method comprising:
setting a frame period, the frame period including one or more light emission periods during which the display panel emits light, and one or more light extinction periods during which the display panel extinguishes light;
dividing at least one frame period into a plurality of light emission periods and a plurality of light extinction periods;
adjusting lengths of the plurality of light emission periods and lengths of the plurality of light extinction periods based on a ratio between a maximum frequency of the frame period and a currently set frequency of the frame period; and
displaying the video image signal by causing light emitting elements of the display panel to emit light during the adjusted lengths of the plurality of light emission periods, and to extinguish light during the adjusted lengths of the plurality of light extinction periods,
wherein a total amount of time of the plurality of the divided light emission periods in a frame is set by a ratio between the maximum frequency of the frame period and a lower frequency of the current frame period, and
wherein the divided light emission periods each have a same time duration when the ratio of the maximum frequency of the frame period divided by the lower frequency of the current frame period is a whole number.

9. A method for driving a display panel, including a plurality of pixel circuits that are arranged in rows and columns, that displays a video image signal that includes a plurality of images having different frame periods, the method comprising:
setting a frame period, the frame period including one or more light emission periods during which the display panel emits light, and one or more light extinction periods during which the display panel extinguishes light;
dividing at least one frame period into a plurality of light emission periods and a plurality of light extinction periods;
adjusting lengths of the plurality of light emission periods and lengths of the plurality of light extinction periods based on a ratio between a maximum frequency of the frame period and a currently set frequency of the frame period; and
displaying the video image signal by causing light emitting elements of the display panel to emit light during the adjusted lengths of the plurality of light emission periods, and to extinguish light during the adjusted lengths of the plurality of light extinction periods,
wherein a total amount of time of the plurality of the divided light emission periods in a frame is set by a ratio between the maximum frequency of the frame period and a lower frequency of the current frame period, and
wherein all but one of the divided light emission periods has a same time duration when the ratio of the maximum frequency of the frame period divided by the lower frequency of the current frame period is not a whole number.

10. The method for driving a display panel according to claim 9,
wherein the one divided light emission period not having the same time duration has a lesser time duration.

11. The method for driving a display panel according to claim 10,
wherein the one divided light emission period having the lesser time duration is located as a last light emission period in a frame period.

12. A non-transitory storage medium that includes a computer program, which when executed by a processor, causes the processor to execute operations for driving a display panel, including a plurality of pixel circuits that are arranged in rows and columns, that displays a video image signal that includes a plurality of images having different frame periods, the operations comprising:
setting a frame period, the frame period including one or more light emission periods during which the display panel emits light, and one or more light extinction period during which the display panel extinguishes light;
dividing at least one frame period into a plurality of light emission periods and a plurality of light extinction periods;
adjusting lengths of the plurality of light emission periods and lengths of the plurality of light extinction periods based on a ratio between a maximum frequency of the frame period and a currently set frequency of the frame period; and
displaying the video image signal by causing light emitting elements of the display panel to emit light during the adjusted lengths of the plurality of light emission periods, and to extinguish light during the adjusted lengths of the plurality of light extinction periods,
wherein only one light extinction period is provided in a frame period set at the maximum frequency.

13. The non-transitory storage medium according to claim 12,
wherein the currently set frequency of the frame period including the plurality of divided light extinction periods is set at a frequency lower than the maximum frequency of the frame period.

14. The non-transitory storage medium according to claim 12,
wherein an initialization period and a writing period follow a last light extinction period in a frame period.

15. A non-transitory storage medium that includes a computer program, which when executed by a processor, causes the processor to execute operations for driving a display panel, including a plurality of pixel circuits that are arranged in rows and columns, that displays a video image signal that includes a plurality of images having different frame periods, the operations comprising:
setting a frame period, the frame period including one or more light emission periods during which the display panel emits light, and one or more light extinction period during which the display panel extinguishes light;

dividing at least one frame period into a plurality of light emission periods and a plurality of light extinction periods;

adjusting lengths of the plurality of light emission periods and lengths of the plurality of light extinction periods based on a ratio between a maximum frequency of the frame period and a currently set frequency of the frame period; and displaying the video image signal by causing light emitting elements of the display panel to emit light during the adjusted lengths of the plurality of light emission periods, and to extinguish light during the adjusted lengths of the plurality of light extinction periods, wherein a total amount of time of the plurality of the divided light extinction periods in a frame is set by a ratio between the maximum frequency of the frame period and a lower frequency of the current frame period, and wherein the divided light extinction periods each have a same time duration when the ratio of the maximum frequency of the frame period divided by the lower frequency of the current frame period is a whole number.

* * * * *